United States Patent
Shveykin

(12) 
(10) Patent No.: US 6,429,462 B1
(45) Date of Patent: Aug. 6, 2002

(54) INJECTION INCOHERENT EMITTER

(75) Inventor: Vasily I. Shveykin, Moscow (RU)

(73) Assignee: D-Led Corporation, Miami, FL (US)

( * ) Notice: Subject to any disclaimer, the term of this patent is extended or adjusted under 35 U.S.C. 154(b) by 0 days.

(21) Appl. No.: 09/474,744

(22) Filed: Dec. 29, 1999

(51) Int. Cl.$^7$ ............................................... H01L 33/00
(52) U.S. Cl. ............................ 257/95; 257/96; 257/98; 257/101; 257/103
(58) Field of Search ............................ 257/94, 95, 96, 257/98, 101, 103, 13, 79

(56) References Cited

U.S. PATENT DOCUMENTS

| | | | | |
|---|---|---|---|---|
| 5,537,433 A |   | 7/1996 | Watanabe | 372/45 |
| 5,705,834 A | * | 1/1998 | Egalon et al. | 257/98 |
| 5,779,924 A | * | 7/1998 | Krames et al. | 216/24 |
| 5,793,062 A | * | 8/1998 | Kish, Jr. et al. | 257/98 |
| 6,057,562 A | * | 5/2000 | Lee et al. | 257/96 |

FOREIGN PATENT DOCUMENTS

| | | |
|---|---|---|
| EP | 0727827 A3 | 8/1996 |
| EP | 0849812 A3 | 6/1998 |
| RU | 1455373 | 1/1989 |
| RU | 2133534 | 7/1999 |
| RU | 2134007 | 7/1999 |
| RU | 2142661 | 12/1999 |
| RU | 2142665 | 12/1999 |
| WO | WO 85/03809 A1 | 8/1985 |

OTHER PUBLICATIONS

Semiconductor lasers emitting at the 0.98 μm wavelength with radiation coupling–out through the substrate; *Quantum Electronics* vol. 28 No. 7, 1998, pp. 605–607, Zvonkov et al.
Abstract of Russian Patent #RU 2133534 obtained from Delphion database (www.delphion.com), Jul. 1999.
Translation of Russian Patent No. RU 2134007, Jul. 1999.
ADC's Epitaxial Mirror on Facet Process Improves 980 nm Pump Laser Reliability, Tim Whitaker, *Compound Semiconductor*, 6(5), Jul. 2000, pp. 52–53, Tim Whitaker.
Dynamics of the optical damage of output mirrors of ridge semiconductor lasers based on strained quantum–well heterostructures, I.V. Akimova et al., *Quantum Electronics*, vol. 28, No. 7, 1998, pp. 629–632.
Resonant Cavity LED's Optimized for Coupling to Polymer Optical Fibers, Ronny Bockstaele et al., *IEEE Photonics Technology Letters*, vol. 11, No. 2, Feb. 1999, pp. 158–160.
High–power 1.3 μm superluminescent diode, Norman S. K. Kwong et al., *Appl. Phys. Lett.* 54 (4), Jan. 23, 1989, pp. 298–300.
Analysis of Semiconductor Laser Optical Amplifiers, M. J. Adams et al., *IEEE Proceedings*, vol. 132, Pt. J, No. 1, Feb. 1985, pp. 58–63.
Efficiency and intensity distribution of a semiconductor leaky–mode laser, A.P. Bogatov et al., *Quantum Electronics*, vol. 26, No. 1, 1999, pp. 28–32.

(List continued on next page.)

*Primary Examiner*—Minh Loan Tran
(74) *Attorney, Agent, or Firm*—Knobbe, Marten, Olson & Bear, LLP

(57) ABSTRACT

An injection incoherent emitter outputs a directed beam of light resulting from spontaneous emission. The emitter provides small divergence angles and enhanced external efficiency, as well as increased energy and light power. Specific ranges of compositions and thicknesses for layers and sublayers in the entire heterostructure, as well as for the layers of the emission output area may be employed to create this emitter. Different embodiments for the heterostructure and output areas permit emission from the emitters in different but controllable directions. One such direction is perpendicular to the active layer. Other embodiments include multibeam incoherent emitters, including embodiments that emit from lines and arrays of emitters, wherein each emitter has an independently controllable beam.

41 Claims, 7 Drawing Sheets

OTHER PUBLICATIONS

Directional radiation pattern of quantum–dimensional InCaAs/GaAs leaky–mode lasers, V.I. Shveikin et al., *Quantum Electronics*, vol. 26, No. 1, 1999, pp. 33–36.

Dynamics of the optical damage of output mirrors of ridge semiconductor lasers based on strained quantum–well heterostructures, I.V. Akimova et al., *Quantum Electronics*, vol. 25, No. 7, 1998, pp. 647–650.

High–Efficiency InGaAlP Visible Light–Emitting Diodes, Hideto Sugawara et al., *Japanese Journal of Applied Physics*, vol. 31, No. 8, Aug. 1992, pp. 2446–2451.

Room–Temperature CW Operation of InGaAsP Lasers on Si Fabricated by Wafer Bonding, Hiroshi Wada et al., *IEEE Photonics Technology Letters*, vol. 8, No. 2, Feb. 1996, pp. 173–175.

Chemically Assisted Ion Beam Etching of GaAs, Ti, and Mo. J.D. Chinn et al., *J. Vac. Sci. Technol. A*, vol. 1, No. 2, Apr.–Jun. 1983, 1983 American Vacuum Society, pp. 701–704.

High–Power Superluminescent Diodes, Gerard A. Alphonse et al., *IEEE Journal of Quantum Electronics*, vol. 24, No. 12, Dec. 1988, pp. 2454–2457.

Thin–Films Field–Transfer Matrix Theory of Planar Multilayer Waveguides and Reflection From Prism–Loaded Waveguides, John Chilwell et al., *J. Opt. Soc. Am. A*/vol. 1, No. 7/Jul. 1984, 1984 Optical Society of America, pp. 742–753.

Wide Spectrum Single Quantum Well Superluminescent Diodes At 0.8 $\mu$m With Bent Optical Waveguide, A.T. Semenov et al., *Electronics Letters*, $13^{th}$ May 1993, vol. 29, No. 10, pp. 854–857.

Superluminescent Diodes with Bent Waveguide, Ching Fuh Lin et al., *IEEE Photonics Technology Letters, vol. 8, No. 2*, Feb. 1996, pp. 206–208.

Low spectral modulation high–power output from a new AlGaAs superluminescent diode/optical amplifier structure, G.A. Alphonse et al., *Appl. Phys. Lett*, 55 (22), Nov. 27, 1989, pp. 2289–2291.

Resonant Cavity LED's Optimized for Coupling to Polymer Optical Fibers, Ronny Bockstaele et al., *IEEE Photoonics Technology Letters*, vol. 11 No. 2, Feb. 1999, pp. 158–160.

P–GaN/N–InGaN/N–GaN Double Heterostructure Blue–Light Emitting Diodes, Shuji Nakamura et al., *Japanese Journal of Applied Physics*, vol. 32, (1993), pp. L8–L11, Part 2, No. 1A/B, Jan. 15, 1993.

High–Brightness AlGaInP 573–nm Light–Emitting Diode with A Chirped Multiquantum Barrier, C.S. Chang et al., *IEEE Journal of Quantum Electronics*, vol. 34, No. 1, Jan. 1998, pp. 77–83.

Very high–efficiency semiconductor wafer–bonded transparent–substrate $(Al_xGa_{1-x})$ $0.5^m0.5$ P/GaP light–emitting diodes, F.A. Kish et al., *Applied Physics Letters*, 64 (21), May 23, 1994., pp. 2839–2841.

* cited by examiner

INJECTION INCOHERENT EMITTER

PRIORITY APPLICATIONS

This application claims priority under 35 U.S.C. § 119(a)–(d) from Russian Patent Application No. 98123248, filed Dec. 29, 1998 (now Russian Federation Patent No. 2142661), and also claims priority under 35 U.S.C. § 119(a)–(d) from International Application No. PCT/RU99/00245, filed Jul. 21, 1999.

BACKGROUND OF THE INVENTION

1. Field of the Invention

The invention relates to optoelectronic technology, and more particularly, to effective, powerful, superbright and compact semiconductor diodes that are sources of spontaneous emission having a narrow beam pattern.

2. Description of the Related Art

The injection incoherent emitter (hereafter referred to as the "Emitter") is a device that converts electricity into optical emission of a specific spectral composition and spatial distribution (in the absence of an optical resonator). Different types of injection incoherent emitters are known for a broad range of wavelengths, from infrared to blue and ultraviolet emissions. These emitters include LEDs that produce surface emission, such as bright multipass LEDs (see, for example, F. A. Kish, et al., *Appl. Phys. Lett.*, Vol. 64, No. 20, pp. 2839–2841 (1994); H. Sugawara, et al., *Jap. J. Appl. Phys.*, Vol. 31, No. 8, pp. 2446–2451 (1992); M. Watanabe, et al., U.S. Pat. No. 5,537,433, Jul. 16, 1996; S. Nakamura, et al., *Jap. J. Appl. Phys. Lett.*, Vol. 34, L1332 (1995)). These emitters also include end emitters (see, for example, A. T. Semenov, et al., *Electron. Lett.*, Vol. 29, pp. 854–857 (1993); G. A. Alphonse, et al., *IEEE J. of Quant. Electronics*, Vol. QE-24, pp. 2454–2457 (1988)). Widespread use of these emission sources, however, is hampered by their insufficiently high efficiency, strength and power of the emission. The divergence of these emission sources is also too high for a number of applications.

An exemplary Emitter is described in F. A. Kish, et al., *Appl. Phys. Lett.*, Vol. 64, No. 20, pp. 2839–2841 (1994). This exemplary Emitter is multipass and includes a heterostructure comprising semiconductor compounds AlGaInP. This Emitter contains an active layer with a broad forbidden band equal to $E_a$ (eV), and thickness $d_a$ in the range of 1–1.5 µm. This Emitter also has two optically uniform cladding layers, one of p-type conductance and the other of n-type conductance. Each cladding layer comprises one sublayer arranged, respectively, on the first and second surfaces of the active layer; the second surface being opposite to the first surface. Emission output areas (hereafter referred to as the "OA") are located on surfaces of the cladding layers not adjacent to the active layer. These OA are made of a homogeneous semiconductor compound transparent to the emitted light, and more particularly, are made of GaP having p- and n-types of conductance, respectively. The OA are in the form of rectangular parallelepipeds having inner surfaces of area $S_{in}$ (µm$^2$) placed on the surfaces of the cladding layers not adjacent to the active layer. Side surfaces of the parallelepipeds form linear slope angles ψ of 90° with the inner and outer surfaces of the OA, as well as with the active layer plane. An injection area for the current carriers having an area $S_{ia}$ (µm$^2$) coincides with the active layer. The injection area is created by forming ohmic contacts on the p- and n-type OA. Metal coating layers are also required. When a direct current is applied in the injection area, non-equilibrium carriers recombine, producing spontaneous emission that propagates from the injection area to all sides of the active layer, including to both OA of p- and n-types. After disorderly, multiple reflections, a certain portion of the spontaneous emission is removed at various angles from the LED through the output surfaces. These output surfaces are located partially on the outer surface of the p-type OA and on the side surfaces of the OA of both types. The divergence angle $\theta_1$ of the output emission in the vertical planes and the divergence angle $\theta_2$ of output emission in the horizontal planes have the maximum permissible value (up to 180°). The vertical planes are defined herein to be planes perpendicular to the active layer plane. The horizontal planes are defined herein to be planes perpendicular to the vertical planes and located on the output surfaces. Note that each direction of emission that passes through the horizontal plane could correspond to its own vertical plane that contains emission beams of the indicated direction. The known Emitter disclosed in F. A. Kish, et al., *Appl. Phys. Lett.*, Vol. 64, No. 20, pp. 2839–2841 (1994) outputs light having a wavelength of 604 nanometers, with an external efficiency of 11.5% and with a light emission power (relative to 1A of current) of 93.2 lm/A. The density of the working current for continuous operating conditions does not exceed 100 A/cm$^2$. The direction of the light rays in relation to the output surfaces in this case is disorderly, i.e., chaotic.

SUMMARY OF THE INVENTION

An object of the present invention is to provide an Emitter with increased external efficiency, increased energy and power, and increased emission intensity and light intensity. Another object of the present invention is to provide the possibility of directed, spontaneous emission for a broad range of directions. A further object of the present invention is the creation of multi-beam Emitters that emit from lines and arrays of emitters, with independent inclusion of each beam. It is an object of the present invention to provide an Emitter having the foregoing features using simplified manufacturing technology.

One aspect of the present invention is an injection incoherent emitter that comprises a heterostructure and at least one emission output area. The heterostructure comprises at least one active layer, a plurality of cladding layers, and a plurality of ohmic contacts. The at least one emission output area is located on at least one side of the active layer. The emission output area adjoins at least one of the cladding layers. The emission output area is transparent for emission. The emission output area comprises at least one emission output area layer having a refractive index $n_{oaq}$, where q=1, 2, . . . p is defined as a whole number that designates the ordinal number of the emission output area layer enumerated from a boundary of the emission output area with the heterostructure. The emission output area and the heterostructure together have an effective refractive index $n_{ef}$. The effective refractive index $n_{ef}$ of the heterostructure and the emission output area and the refractive index $n_{oa1}$ of the emission output area are selected to satisfy the correlations:

$$\arc \cos(n_{ef}/n_{oa1}) \leq \arc \cos(n_{ef\,min}/n_{oa1})$$

and $n_{ef\,min}$ is greater than $n_{min}$.

In the correlations, $n_{ef\,min}$ is the minimum value of $n_{ef}$ for heterostructures and adjoining emission output areas that produce spontaneous emission, and $n_{min}$ is the least of the refractive indices in the heterostructure cladding layer.

BRIEF DESCRIPTION OF THE DRAWINGS

The present invention will be described in detail below in connection with FIGS. 1–20, in which.

DETAILED DESCRIPTION OF THE PREFERRED EMBODIMENT

Figure 1:
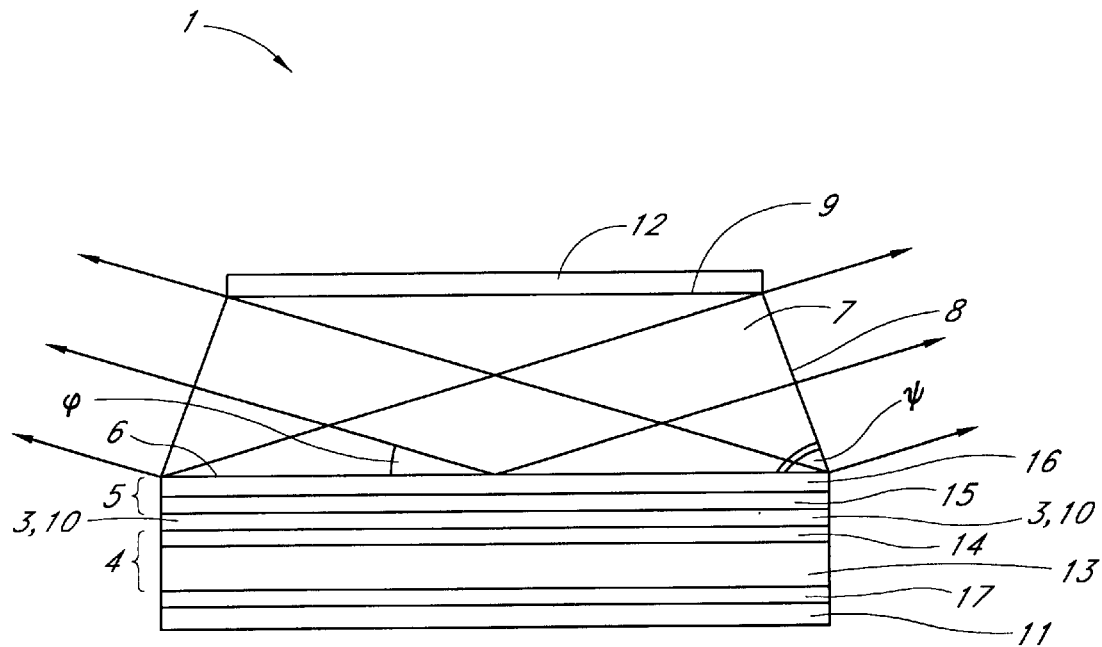
FIG. 1 is a schematic illustration of a cross-section of an emitter that passes through the central axis of symmetry of the emission output area made in the form of a truncated right angle cone, with the side surface of the emission output area forming a linear slope angle ψ with the inner surface of the output area, wherein ψ equals $(\pi/2-\phi)$.

In accordance with the present invention, the objects are accomplished by an injection incoherent emitter that includes a heterostructure that contains an active layer, cladding layers, ohmic contacts, and an emission output area. At least on one side of the active layer, the emission output area adjoins the corresponding cladding layer. The emission output area is made of one or more layers characterized by refractive index $n_{oaq}$ and emission optical loss factor $\alpha_{oaq}$ (cm$^{-1}$) and having thickness $d_{oaq}$ ($\mu$m), where q=1,2 ... p are defined as whole numbers that designate the ordinal number of the output area layer enumerated from its boundary with the heterostructure. The emission output area is also transparent for emission. The heterostructure with emission output area connected to it is characterized by effective refractive index $n_{ef}$. The effective refractive index $n_{ef}$ and refractive index $n_{oa1}$ satisfy the correlations:

arc cos($n_{ef}/n_{oa1}$)≦arc cos($n_{ef\,min}/n_{oa1}$), and $n_{ef\,min}$ is greater than $n_{min}$;

In the foregoing correlations, $n_{ef\,min}$ is the minimum value of $n_{ef}$ of all possible $n_{ef}$ for the heterostructure sets that are of practical value with emission output areas, and $n_{min}$ is the least of the refractive indices in heterostructure cladding layers.

One particular innovative aspect of the Emitters in accordance with the present invention is the significant features of the entire heterostructure and of the emission output area, which impact on the functioning and the resulting output characteristics of the Emitters. The number of layers and sublayers of the heterostructure as well as their thicknesses and composition were selected for the proposed Emitter so that a narrow-beam pattern is obtained mainly in the vertical planes for intensive, spontaneous emission that emerges from the injection area. This narrow beam pattern is primarily directed at angles of propagation φ in relation to the active layer plane. A necessary condition for production of a narrow-beam pattern is fulfillment of the correlation known as the condition for leaking modes of laser radiation that are propagated in the optical resonator of laser diodes. This condition, described in J. K. Buttler, et al., *IEEE Journ. Quant. Electron.*, Vol. QE-11, p. 402 (1975), requires that:

$$n_{ef} < n_{oa1} \tag{1}$$

The value of the effective refractive index $n_{ef}$ can be obtained by calculation from the correlation $\beta=(2\pi/\lambda)\,n_{ef}$, where β is the modulus of complex magnitude of constant propagation for an emission wave in one of the directions in the active layer, while λ is the emission wavelength.

In accordance with the preferred embodiment of the present invention, it has been confirmed experimentally that the condition (1) is also applicable for spontaneous emission. Consequently, the angle of propagation φ of the directional spontaneous emission is defined as equal to the angle of leaking modes of laser radiation—namely, $$\phi = arc \cos(n_{ef}/n_{oa1}) \qquad (2)$$

In addition, in accordance with the present invention, the entire range of propagation angles φ of directional, spontaneous emission may be used, and correspondingly, the ratio $(n_{ef}/n_{oa1})$ may be used. The conditions (1) and (2) define the lower boundary of angle φ (φ is greater than zero). In accordance with the present invention, the upper boundary of these propagation angles $\phi_{max}$ is defined by the formulas:

$$arc \cos(n_{ef}/n_{oa1}) < arc \cos(n_{ef\,min}/n_{oa1}) = \phi_{max} \qquad (3)$$

$$n_{ef\,min} \text{ is greater than } r_{min} \qquad (4)$$

In formulas (3) and (4), $n_{ef\,min}$ is the minimum value $n_{ef}$ of all possible $n_{ef}$ for the sets of heterostructures of practical value with emission output areas, and $n_{min}$ is the least of the refractive indices in the heterostructure cladding layers. Numerical calculations have been made for certain practical heterostructures (e.g., heterostructures based on compounds InGaAs/GaAs/AlGaAs), and the calculations have indicated that the critical angle of outflow $\phi_{max}$ is approximately 30° to 35°.

The divergence angle Δφ in the vertical planes for spontaneous emission propagating in the OA is determined by spectral dispersion. Spectral dispersion is the spread of propagation angle φ. This spectral dispersion depends on wavelength X, which changes within the spectral band Δλ of spontaneous emission. The spectral dispersion also depends on diffraction. The angle of dispersion divergence $\Delta\phi_1$ can be defined by numerical calculation using formula (2), with known dependencies of the refractive indices $n_{ef}$ and $n_{oa1}$ on wavelength λ in the range of Δλ.

By using the known approximate correlation discussed in Kh. Keysi, M. Panish, "Lazery na geterostrukturakh" (Lasers on Heterostructures), Part 1, Publ. "Mir", Moscow, 1981, pp. 89–97, the angle of diffraction divergence $\Delta\phi_2$ can be written as:

$$\Delta\phi_2 \cong \gamma \times \lambda / (n_{ef} \times D_{ia} \times \sin\phi) \qquad (5)$$

In the correlation (5), γ is the numerical coefficient that indicates which level of emission intensity defines angle Δφ (γ equals one at level 0.5, and γ equals two at level 0.1). The value $D_{ia}$ is the size of the injection area in the plane of the active layer in the selected direction. The complete divergence angle Δφ of emission in the vertical plane inside OA equals $\Delta\phi_1 + \Delta\phi_2$. The divergence angle $\theta_1$ of the output emission in the vertical plane outside the OA is determined using the known Fresnel formulas (see, e.g., R. Ditchbem, Fizicheskaya optika [Physical Optics], Publ. Nauka, Moscow, 1965, pp. 398–402). In particular, $\theta_1$ is approximately equal to arcsin[n×sin(Δφ)]. Based on the smallness of angle Δφ, angle $\theta_1$ can be estimated as:

$$\theta_1 \cong (n_{oa1}/n_0) \times \Delta\phi \qquad (6)$$

Here $n_0$ is the refractive index of the medium that borders with the output surface. For air, $n_0$ equals one.

The efficiency of input $\eta_{in}$ into the OA of the resulting directional spontaneous emission is defined by the ratio of the number of spontaneous photons entering from the injection area into the OA at propagation angles from (φ−Δφ/2) to (φ+Δφ/2) to the total number of spontaneous photons in the injection area. We found that $\eta_{in}$ can be defined as:

$$\eta_{in} = (g - \alpha_{ia} - \alpha_{end})/g = \alpha_{out}/(\alpha_{out} + \alpha_{ia} + \alpha_{end}) \qquad (7)$$

In formula (7), g (cm$^{-1}$) is the emission amplification factor in the heterostructure due to injection current density j(A/cm$^2$), $_{ia}$(cm$^{-1}$) is the optical loss factor defined by the absorption and scattering of emission in the injection area, $\alpha_{end}$(cm$^{-1}$) is the loss factor defined by the outgoing emission through the end boundaries of the injection area, and $\alpha_{out}$ is the useful loss factor of the directional spontaneous emission emerging from the injection area into the OA. Consequently, $\eta_{in}$, the efficiency of input (which to a significant degree determines the external efficiency of the Emitter), is mainly controlled by the thickness and/or composition (refractive index) of the cladding sublayers that adjoin the OA. With selection of $g>>(\alpha_{ia}+\alpha_{end})$, or equivalently, $\alpha_{out}>>(\alpha_{ia}+\alpha_{end})$, the quantity $\eta_{in}$ could be close to one. Depending on the nature of the cladding layers, both one-sided and two-sided output of spontaneous emission from the injection area are possible.

The assumption upon which the present invention is based, that the appropriate selection of the heterostructure can provide for narrow-beam spontaneous emission, is not obvious. There are prevalent opinions that spontaneous emission inside the heterostructure is not directional due to the chaotic propagation of individual spontaneous photons (see, for example, Yu. R. Nosov, "Optoelektronika" [Optoelectronics], Moscow, Publ. "Radio i svyaz" [Radio and Communications], p.141 (1989). By implementing the essential features of the preferred Emitter, a narrow beam pattern of spontaneous emission in vertical planes is obtained. Effective removal of the spontaneous emission results in super-high external efficiency in terms of energy, light power, emission intensity, and light intensity. Additionally, the production of outputs in various controllable directions, including emission perpendicular to the active layer, is possible. The performance of this emitter has been demonstrated experimentally and confirmed by calculation. Applying the features combined in the preferred embodiment may lead to multi-beam Emitters. Such multi-beam sources may include those that emit from a line or an array of emitters with independent control of their beams.

All of the noted features of the invention make it possible to produce the Emitter according to the present invention in different embodiments, which are described below. Possible modifications may include varying the compositions, the widths, the thicknesses, and the number of layers and sublayers in both the heterostructure and the OA. Also, different and unusual configurations of the OA can be realized to obtain a highly efficient output comprising directional spontaneous emission.

The selection of the OA design is based on the fact that one distinguishing characteristic of the Emitter is that the spontaneous emission has a narrow beam pattern in the vertical planes. In the corresponding horizontal planes, however, the spontaneous emission is propagated with equal probability in any direction. Unlike the leaking mode in injection lasers, the range of angular distribution for the spontaneous emission is about 2π. Here, as well as in the well-known emitter described in F. A. Kish, et al., *Appl. Phys. Lett.*, Vol. 64, No. 20, pp. 2839–2841 (1994), the horizontal plane is defined as a plane that is perpendicular to the corresponding vertical plane, which, in turn, is perpendicular to the active layer plane. The distribution of emission establishes the dependence of the effective output of spontaneous emission from the OA on the configuration of the OA. More particularly, the angle of emission determines the slope angles ψ between the side surface of the OA and its inner surface (i.e., the surface adjacent to the cladding). The greatest efficiency can be achieved when the OA is selected in the form of a solid of revolution in relation to the axis that is perpendicular to the plane of the injection area and passes through its center (e.g., in the form of a truncated right cone or right circular cylinder). Different directions of emission removal (relative to the active layer plane) are established by the appropriate selection of the slope angles ψ, which in turn depend on angle φ. In individual cases, the OA may be made not only in the form of a solid of revolution but also, for example, in the form of a hexahedron, although, in this case, the efficiency of emission extraction from the OA will be diminished.

The foregoing objectives are also achieved in the embodiments listed below.

The active layer may be formed of at least one sublayer. The cladding layers are located, correspondingly, on the first and second surfaces of the active layer; the second surface being opposite to the first surface. The cladding layers are formed from cladding sublayers $I_i$ and $II_j$, respectively, where i=1, 2, . . . k and j=1, 2, . . . m are defined as whole numbers that designate the ordinal number of the cladding sublayers enumerated from the active layer. In each cladding layer, there is at least one cladding sublayer. These cladding sublayers have corresponding refractive indices, $n_{Ii}$ and $n_{IIj}$.

Possible embodiments include Emitters having heterostructure designs in which at least one cladding layer may be formed as a gradient (i.e., the layer has a monotonically changing composition). This gradient cladding layer is viewed as a finite number of sublayers in the cladding layer having corresponding $n_{Ii}$ and $n_{IIj}$ obtained by dividing each gradient cladding layer. Other embodiments of the Emitter include heterostructure designs for which the active layer can be made in the form of one or several active sublayers separated from each other by barrier sublayers. The sublayers comprising the active layer may have quantum-dimensions thicknesses while the cladding layer may comprise one or several sublayers and may be formed as a gradient. These different heterostructure designs make it possible to improve the internal efficiency of converting injected nonequilibrium carriers into spontaneous photons, and at the same time, to increase the overall efficiency of the Emitter.

The objectives listed above are also achieved in the following embodiments.

The operating Emitter has at least one injection area. The injection area in the working device essentially coincides with the active layer for that part of it, i.e., the area in which there is injection of nonequilibrium carriers. The presence of a number of injection areas makes it possible to create multi-beam Emitters.

In preferred embodiments to be manufactured, the thickness of the cladding layer that adjoins the OA is less than the thickness of the cladding layer located on the opposite side of the active layer. Additionally, the refractive index of the cladding sublayer that adjoins the area of emission output is preferably greater than the refractive index of the external cladding sublayer that is located on the opposite side of the active layer.

Advantageously, the preferred embodiment produces one-sided propagation of spontaneous emission from the injection area into the OA with a significant improvement in directionality and an increase of external efficiency.

The direct projection of the injection area onto the inner OA surface must not be beyond the boundaries of the OA surface. Selection of the thickness $d_{oa1}$ depends on the propagation angle φ, the maximum size $D_{ia}$ of the injection area, and the slope angle ψ. Consequently, in the preferred embodiment, the dimensions and the area $S_{ia}$ of the injection area preferably do not exceed the dimensions and the area $S_{is}$ of the introduced inner surface of the emission output area that adjoins the corresponding cladding layer of the heterostructure. Additionally, the thickness of the emission output area $d_{oaq}$ preferably is in a range between 1 and 10,000 μm.

In some preferred embodiments of the present invention, the area of emission output is conducting and an ohmic contact is formed to the introduced outer surface of the emission output area. This arrangement permits simplification of the technology for manufacturing the Emitter.

In the preferred embodiments of the Emitter of the present invention, the OA is made of optically homogeneous material. The requirement that the OA be transparent for spontaneous emission means that in order for the Emitter to operate efficiently, the OA must be characterized as having low optical losses due to absorption and scattering of spontaneous emission. For a one-layered OA, this requirement is satisfied when the following condition is met:

$$\alpha_{oa1} << (\mu \times D_{is})^{-1} \quad (8)$$

In condition (8), μ is a number that could change approximately from 0.4 to 1.5 depending on the OA configuration, and $D_{is}$ is the size of the OA inner surface in the chosen direction. For semiconductor materials, for example, the width of the forbidden band for the OA $E_{oa1}$ must be greater than the width of the forbidden band of the active layer $E_a$. Note that the forbidden band of the active layer $E_a$ defines the emission wavelength λ. In those cases, where the OA is non-conducting, in order to obtain low values of $\alpha_{oa1}$ (cm$^{-1}$), the OA preferably comprises at least two layers. The first layer of the OA, which borders the heterostructure, should be conducting, and the second layer of the OA should comprise a material that has a lower optical loss factor $\alpha_{oa2}$ than $\alpha_{oa1}$ for the first layer. In this case, the second layer could be insulating. This design improves the efficiency of the Emitter by reducing the optical losses for absorption and scattering of emission when passing through the OA.

By selecting a refractive index $n_{oa1}$ for the first layer that is different from the refractive index $n_{oa2}$ for the second layer, the propagation of emission in the OA layers is controllable. The refractive indices $n_{oa1}$, $n_{oa2}$ also control the thickness of the OA and its layers. Emission is propagated through the first layer at propagation angle φ equal to arc $\cos(n_{ef}/n_{oa1})$ while emission is propagated through the second layer, at propagation angle $\phi_2$ equal to arc $\cos(n_{ef}/n_{oa2})$. (See equation (2).) Similarly, for the $q^{th}$ layer of the OA:

$$\phi_q = arc\ \cos(n_{ef}/n_{oaq}) \quad (9)$$

The propagation angle $\phi_2$ on the boundary of two OA layers will thus be changed in any direction. For example, for an OA consisting of two layers, the angle $\phi_2$ will be greater than the angle φ if the refractive index $n_{oa2}$ of the second layer is selected to be smaller than the refractive index $n_{oa1}$ of the first layer that borders the heterostructure. For the opposite case, where $n_{oa2}$ is greater than $n_{oa1}$, the thickness of the second layer could be less than in the case where $n_{oa2}$ is less than $n_{oa1}$. Having a thinner second layer reduces the thickness of the OA, thereby simplifying the technology and reducing the manufacturing expenses of the Emitter. Another method of reducing the propagation angles $\phi_q$ comprises introducing sublayers $I_i$, and/or $II_j$ with refractive index more than $n_{ef}$ into the cladding layers of the heterostructure with OA connected to it (which together has an effective refractive index $n_{ef}$).

In addition, at least one layer of the emission OA preferably is made of semiconductor material, and at least one layer of the emission OA is preferably made of an introduced substrate material, thereby simplifying the Emitter manufacturing technology.

In all of the embodiments discussed above having a multi-layer OA with an electrically conducting first layer, ohmic contact is made to the first electrically conducting OA layer. This arrangement reduces the thermal losses due to resistance and simplifies the Emitter manufacturing technology. Preferably, the thickness of the electrically conducting layer is not bigger than the minimum linear dimension of the injection area. The effectiveness of the ohmic contact depends on the dimensions of the injection area and on the densities of currents that pass through the proposed Emitter. Of further note, the OA can generally be made of more than semiconductor materials. In particular, the refractive index $n_{oa1}$, and more generally a refractive index $n_{oaq}$ (see Equation (9)), and the optical loss factor $\alpha_{oaq}$ need only satisfy the necessary requirements set out in Equation (1) and Equation (8).

The objectives of the present invention are also achieved using different proposed modifications to the OA designs. One embodiment of the present invention has at least one emission output area formed as truncated right circular cone, one whose base is located on the cladding sublayer adjoining it. The side surface of the cone is formed by its generatrix. Emitters having an OA with this conical configuration could emit in different directions and obtain maximum efficiency, power and strength of emission for emissions at normal incidence to the output surfaces.

In addition, this embodiment preferably contains the following features:

To produce emission at the propagation angle $\phi$ relative to the active layer plane, the linear slope angles $\psi$ of the generatrix of the side surface of the emission output area with respect to inner surface of the OA are selected in the range from $(\pi/2-\phi-\sigma)$ to $(\pi/2-\phi+\sigma)$. Consistent with its usage above, $\phi$ is defined as the angle between the plane of the active layer and the perpendicular to the wavefront of the emission that propagates in the emission output area, and $\sigma$ is the angle of total internal reflection from the output surface for emission that propagates in the emission output area.

To produce emission output directed at a right angle relative to the plane of the active layer and towards the side of the emitter where the emission OA is located, the linear slope angles $\psi$ between the side surface generatrix of the emission output area and its inner surface should be selected from the range $(3\pi/4-\phi/2-\sigma/2)$ to $(3\pi/4-\phi/2+\sigma/2)$.

To produce emission output directed at a right angle relative to the plane of active layer and towards the location of the heterostructure, the linear slope angles $\psi$ between the side surface generatrix of the emission output area and its inner surface should be selected from the range $(\pi/4-\phi/2-\sigma/2)$ to $(\pi/4-\phi/2+\sigma/2)$.

The objectives of the present invention are also achieved by forming an output area comprising at least one cylinder whose base is located on the cladding layer adjoining it. Such an arrangement simplifies the manufacturing technology and produces enhanced characteristics of the Emitter when directional multiple reflections to the OA are used.

One additional preferred embodiment includes an emitter in which the OA comprises at least one hexahedron whose base is located on the cladding layer adjoining it. In this embodiment, the following features are preferred:

Select the linear slope angle $\psi$ between at least one of the side surfaces of the hexahedron and the inner surface of the output region to be in the range from $(\pi/2-\phi-\Delta\phi/2)$ to $(\pi/2-\phi+\Delta\phi/2)$, where $\Delta\phi$ is the emission divergence angle in the vertical plane.

Select the linear slope angle $\psi$ between at least one of the planar side surfaces of the hexahedron and inner surface of the output area to be in the range from $(3\pi/4-\phi/2-\Delta\phi/2)$ to $(3\pi/4-\phi/2+\Delta\phi/2)$.

Select the linear slope angle $\psi$ between at least one of the planes side surfaces of the hexahedron with the inner surface of the output area to be in the range from $(\pi/4-\phi/2-\Delta\phi/2)$ to $(\pi/4-\phi/2+\Delta\phi/2)$.

Select the linear slope angle $\psi$ between least one of the planar side surfaces of the hexahedron and the inner surface of the output area to be equal to $\pi/2$. Selection of the OA design in the form of a hexahedron makes it possible to simplify the manufacturing technology, and also reduces the spatial extent of the near field emission, while simultaneously increasing the brightness of the Emitter.

For those Emitters in which the OA is made in the form of a cylinder, or in the form of a hexahedron, and whose output surface is perpendicular to the active layer plane, the propagation angle $\phi$ should be smaller than the angle of total internal reflection $\sigma$, which makes it possible to exclude the total internal reflection of the emission exiting the OA from the output surface and the corresponding losses.

Additionally, at least on part of the introduced output surfaces, anti-reflection coatings may be introduced, while on another part of the output surfaces, reflecting coatings may be introduced to further increase the efficiency, power, strength and brightness of the Emitters.

Embodiments of the present invention include Emitters with a plurality of output beams of directional emission. These embodiments differ from those described above in that during their production, at least two injection areas with identical propagation angles $\phi$ are formed in the heterostructure. Separate ohmic contacts may be formed with the outside of the heterostructure to provide individual supply of power current for independent control of the beams to each injection area.

In one embodiment of the multi-beam Emitter, an OA could be provided for each injection area with independent ohmic contact.

In another embodiment of the multi-beam Emitter, one single common OA could be provided at least for part of the injection area, both with independent contact and without it.

Emitters that have a linear sequence of the output beams of directional spontaneous emission and that are independently engaged by power supply current can be produced. The objectives of the invention are achieved in the fabrication of these Emitters by implementing the following measures:

Injection areas of similar dimensions having independent contacts are arranged in order and along one line in the heterostructure, thereby creating a linear sequence of the injection areas.

Metal coating layers are preferably made in the form of strips that electrically connect the injection areas in the linear sequence. These strips are preferably formed on the side of the emission output area, at least on part of their external surfaces.

Emitters that are arranged so as to produce an array of output beams of directional spontaneous emission that are independent engaged by power supply current can be produced. The objectives of the invention are achieved in the fabrication of these emitters by implementing the following measures:

In the heterostructure, at least two linear sequences of the injection areas are formed.

Metal coating layers are preferably made in the form of strips that are each electrically connected to independent contacts for one injection area in the linear sequences of injection areas. These strips are preferably on the side of the injection area, at least on part of their external surfaces.

In order to increase efficiency by reducing losses of nonequilibrium carriers due to their spreading and surface recombination, the injection area dimensions are preferably limited by barrier layers inserted up to and including the active layer.

In order to increase efficient matching of the Emitters with the power source through sequential electrical connection of the injection areas, at least two neighboring injection areas are electrically isolated up to the second insulating OA layer. The ohmic contacts of these injection areas, however, remain electrically connected through a metal coating layer.

The preferred embodiments of the present invention comprise an original heterostructure designs formed with specific composites, thicknesses, and number of layers and sublayers. This embodiment also includes a non-apparent design for the emission output area which is made of materials having refractive indices with specific magnitudes, and with a specific number of layers. With this Emitter, directional, spontaneous emission can be formed with subsequent efficient emergence of this emission from the output area. Removal efficiency is also improved by selecting the corresponding slope angles ψ for the OA side surface. All of the foregoing design features enable increased external efficiency, increased energy and light power, increased emission and light intensity of the injection incoherent emitter, and also produce spontaneous emission of high directionality for a range of different directions. Additionally, creation of a multi-beam Emitter that emits from lines and arrays of emitters, with independent engagement of each beam is possible using simplified manufacturing technology.

The preferred embodiment can be realized using basic production processes that are well known. The range of wavelength emission for the currently developed emitters extends from infrared to ultraviolet emissions. Accordingly, different heterostructures can be used depending on the wavelength desired:

For ultraviolet, blue and green emissions (0.36 μm<λ<0.58 μm) the most effective heterostructures are based on semiconductor compounds in the AlGaN/GaN/GaInN system, as well as ZnCdSSe/GaAs;

For red and yellow emissions (0.58 μm<λ<0.69 μm), compounds in the AlGaInP/GaAs system are preferred;

For infrared emissions, wherein 0.77 μm<λ<1.2 μm, compounds in the AlGaAs/GaAs system and in the InGaAs/GaAs/AlGaAs system are preferred;

For infrared emissions, wherein 1.2 μm<λ<2.0 μm, compounds in the GaInAsP/InP system are preferred; and For infrared wherein 2.0 μm<λ<4.0 μm, compounds in the AlGaInSbAs/GaAs system are preferred.

The corresponding materials for the OA that meet conditions (1) and (8) in each of the indicated ranges of wavelengths and for the chosen heterostructure must be selected. The following semiconductor materials for the OA are preferred:

GaN for the AlGaN/GaN/GaInN system;
ZnSe for the ZnCdSSe/GaAs system;
GaP for the AlGaInP/GaAs system;
GaP for the AlGaAs/GaAs system;
GaAs and GaP for the InGaAs/GaAs/AlGaAs system;
Si and GaAs for the GaInAsP/InP system; and
Si and GaAs for the AlGaInSbAs/GaAs system.

The designs described above could be successfully implemented using recently developed technology of "wafer bonding" (see, for example, H. Wada, et al., *IEEE Photon. Technol. Lett.*, Vol. 8, p. 173 (1996)).

The embodiments of the present invention comprising Emitters with directional spontaneous emission are applicable at least for emission at all the aforementioned wavelength ranges using the heterostructure systems described above. White emission emitters used for illumination can be produced by the following methods:

either by mixing emissions of three basic colors of red, green and blue; or by exciting luminescent red and green emissions from the Emitter of blue emission in a substance especially selected for this purpose.

The present invention is further explained by specific variations of its design with references to the attached drawings. The present invention is not limited to the embodiments described. Rather, the present invention may include other embodiments having features that are encompassed within the combination of features recited in the claims.

Figure 7:
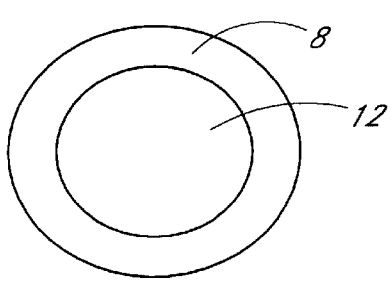
FIG. 7 is a schematic illustration of a view from above (i.e., from the side of the output area) for the Emitter having the cross-section depicted in FIG. 1.

As schematically illustrated in FIGS. 1 and 7, an Emitter 1 in accordance with one of the embodiments of the present invention includes a heterostructure 2 that was developed by the well-known method of MOCVD (metal organic chemical vapor deposition). The heterostructure 2 contains an active layer 3 placed between cladding layers 4 and 5, with sublayers $I_i$ and $II_j$, respectively, where i=1 . . . k, while j=1 . . . m. Although not shown in FIG. 1, it should be understood that the active layer 3 in this case comprises several active sublayers, with barrier sublayers dividing the active sublayers. An output area (OA) 7 comprises a semiconductor having the shape of a truncated right circular cone defined by a generatrix at an angle ψ. The OA 7 is located on the surface of sublayer fin, of the cladding layer 5 (i.e., on the surface of a sublayer not adjacent to the active layer 3). The OA 7 has a side surface 8 having a slope angle (generatrix angle) ψ defined with respect to the inner surface 6 that is equal to 72°. The height of the cone is 921 μm. The circular base of the cone has a diameter of 3000 μm that corresponds to the diameter of the inner surface 6 of the output area 7. The top of the conical OA 7 is circular and has a diameter smaller than 2,401 μm, which defines an outer surface 9 of the OA 7. The Emitter 1 has an injection area 10 that coincides with the active layer 3, their surfaces being the same. The injection area 10 is circular and has a diameter $D_{ia}$ of 3000 μm and an area $S_{ia}$ equal to 0.07065 cm². The thickness of the injection area 10 equals the thickness of active layer 3. A first ohmic contact 11 is formed on the side of the Emitter 1 that is opposite to the OA 7, while a second ohmic contact 12 is formed on outer surface 9 of the OA 7. The first cladding layer 4 in this embodiment comprises sublayers 13 ($I_1$) and 14 ($I_2$), while the second cladding layer 5 comprises sublayers 15 (II$_1$) and 16 (II$_2$). A semiconductor contact layer 17 is located on the surface of sublayer I$_k$ of first cladding layer 4 far from active layer 3, and, in a particular embodiment, is located on the sublayer 14. The contact layer 17 is designed to reduce the Emitter's ohmic resistance. The contact layer 17 may not be required when making heterostructures 2 of the Emitter from other semiconductor compounds (e.g., GaInAsP/InP, as discussed above). The composition, thicknesses, refractive indices, type, alloying concentrations and absorption factors of the layers and sublayers of the heterostructure 2, as well as the contact layer 17 and the OA 7 are given in the Table below. The emission wavelength λ for the composition of the active layer 3 of the heterostructure 2 specified in Table is 604 nanometers.

The conventional arrows in FIG. 1, as well as in subsequent FIGS. 2–6, 12, 13 and 15, depict the directions of laser radiation propagated within and outside the OA 7. The linear slope angles ψ between the inner surface 6 and the side surface 8 are read in the direction from the inner surface 6 in accordance with convention.

Figure 11:
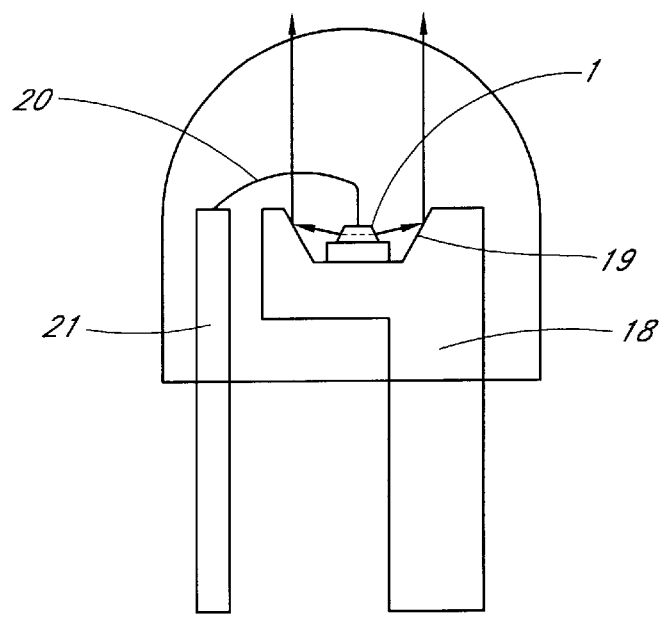
FIG. 11 is a schematic illustration of a cross-section of the emitters in accordance with the present invention installed on a holder.

In a preferred embodiment, the Emitter 1 is mounted on a support (holder) 18, such as the support 18 with conical sloped reflecting walls 19 shown in FIG. 11. The support 18 is also an electrical terminal. Contact between the ohmic contact of Emitter 1 and the support 18 is provided, for example, by electrically conducting paste containing silver. The other ohmic contact 12 of the Emitter 1 is connected to another electrical terminal 21 with a wire 20. The required power is fed to the ohmic contacts 11 and 12 via the support 18 and the terminal 21. The support 18 with Emitter 1 therein can be advantageously filled with a transparent compound (not shown in FIG. 11) having a refractive index n$_0$ equal to 1.5.

The primary parameters for this and subsequent Emitters 1 were obtained by numerical calculations. The values of the effective refractive index n$_{ef}$, propagation angle φ, emission amplification factor g, as well as the dispersion divergence angle Δφ$_1$ for the oriented spontaneous emission were calculated by a program based on a matrix method for solving Maxwell's equations with the appropriate boundary conditions defined by the multilayer heterostructures. See, for example, J. Chilwall, et al., *J. Opt. Soc. Amer., A*. Vol. 1, No. 7, pp. 742–753 (1984).

The following results were obtained specifically for the Emitter 1 with the heterostructure 2 and the OA 7 having the characteristics given in the Table:

- the effective refractive index n$_{ef}$ equals 3.2921;
- the propagation angle φ equals 18°;
- the emission amplification factor g in the active layer 3 equals 391 cm$^{-1}$ when the current density through device j is 100 A/cm$^2$; and
- the angle of divergence resulting from dispersion Δφ$_1$ for spontaneous emission inside the OA 7 equals 11.6 mrad (milliradians). (For the numerical calculations, the spontaneous emission spectral line half-width was assumed to be 20 nanometers).

The divergence angle resulting from diffraction Δφ$_2$ (see Equation (5)) was only 0.2 mrad. Based on this, the complete divergence angle Δφ inside the OA 7 equals 11.8 mrad. The divergence angle θ$_1$ in the vertical plane of emission after exiting the OA 7, as determined by Equation (6), equals 40.8 mrad (2.3°). In the near field, the output spontaneous emission has the shape of the ring shaped or annular surface located on side surface 8 of the OA 7. The width of this ring equals 930 μm, while its total area is 0.028 cm$^2$. Output emission along the entire perimeter of the ring is inclined at an angle φ relative to active layer 3 plane equal to 18°.

External efficiency η was calculated by the formula for the embodiment of Emitter 1 wherein the spontaneous emission is normally incident on the output surface:

$$\eta = \eta_i \times \eta_{in} \times \eta_\alpha \times (1-R) \times [1 + (\eta_{in} \times \eta_\alpha^2 \times R)^1 + (\eta_{in} \times \eta_\alpha^2 \times R)^2 + (\eta_{in} \times \eta_\alpha^2 \times R)^3 + \ldots] \quad (10)$$

In Equation (10), η$_i$ is the internal quantum efficiency defined by the ratio of the number of emerging photons of spontaneous emission to the number of injected pairs of electrons and holes; R is the reflection factor for spontaneous emission normally incident on the output surface of the OA 7; and η$_\alpha$ is the efficiency that defines emission optical losses (absorption, scattering) during a single passage through the OA 7. The value of η$_\alpha$ in Equation (10) is determined by the following relation:

$$\eta_\alpha = \exp(-\alpha_{oa1} \times \mu \times D_{is}) \quad (11)$$

In Equation (11), μ is the number which, depending on the OA configuration, can vary approximately from 0.4 to 1.5, and D$_{is}$ is the diameter of inner surface 6 of OA 7.

The calculation of η$_{in}$ in Equation (10) was made using Equation (7). In the calculations, η$_i$ was assumed to be equal to one (which is usually true for quality heterostructures), α$_{ia}$ was assumed to be 5 cm$^{-1}$, and α$_{oa1}$ was assumed to be 0.6 cm$^{-1}$. See, for example, *Opticheskiye svoyslva poluprovodnikov*, [Optical Properties of Semiconductors], ed. by R. Willardson and A. Bir, Publ. "Mir", pp. 454–458, Moscow, 1970. The losses for spontaneous emission emerging from the edge surfaces of injection area 10 were not considered in the calculations since they are small in magnitude (i.e., α$_{end}$ was assumed to equal zero). Efficiency factors η$_{in}$, defined in Equation (7), and η$_\alpha$, defined in Equation (11), equaled 0.9872 and 0.9180, respectively. In the calculation of η$_\alpha$, as defined by Equation (11), the numerical coefficient μ was taken to be (0.5 cosφ) or, more specifically, 0.4756. The external efficiency η of the Emitter 1 was calculated to be equal to 0.8608 using Equation (10) and commonly accepted assumptions.

The output power P (Watts) of the spontaneous emission was defined according to the formula:

$$P = \eta \times J \times (h\nu) \quad (12)$$

where J (Amperes) is the working current that passes through the injection area, while hv is the emission quantum energy expressed in volts. The power of the spontaneous emission P that can be defined for a current J equal to 7.065 A and can be obtained for a working current density of 100 A/cm$^2$ is 12.5 W. The power of the emission relative to one unit of area for emission in the near field equals 83.3 W/cm$^2$. Based on the visibility curve, for an emitted wavelength of 604 nanometers, the power of the spontaneous emission, 12.5 W, corresponds to light power P$_{light}$ equal to 4,952 lumens. The intensity of light Q$_{light}$, defined by the ratio of the light power P$_{light}$ to full solid angle (2π×Δφ) in which it is radiated, equals 19,327 candelas (cd).

Figure 17:
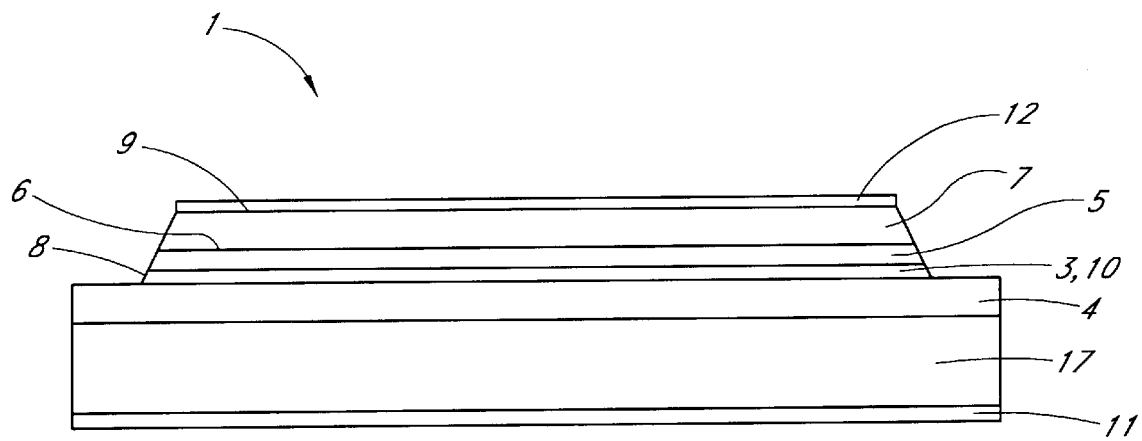
FIG. 17 is a schematic illustration of a cross-section on the symmetry plane for an Emitter having an output area made in the form of a set of nine truncated right angle cones arranged in order and connected together.
Figure 18:
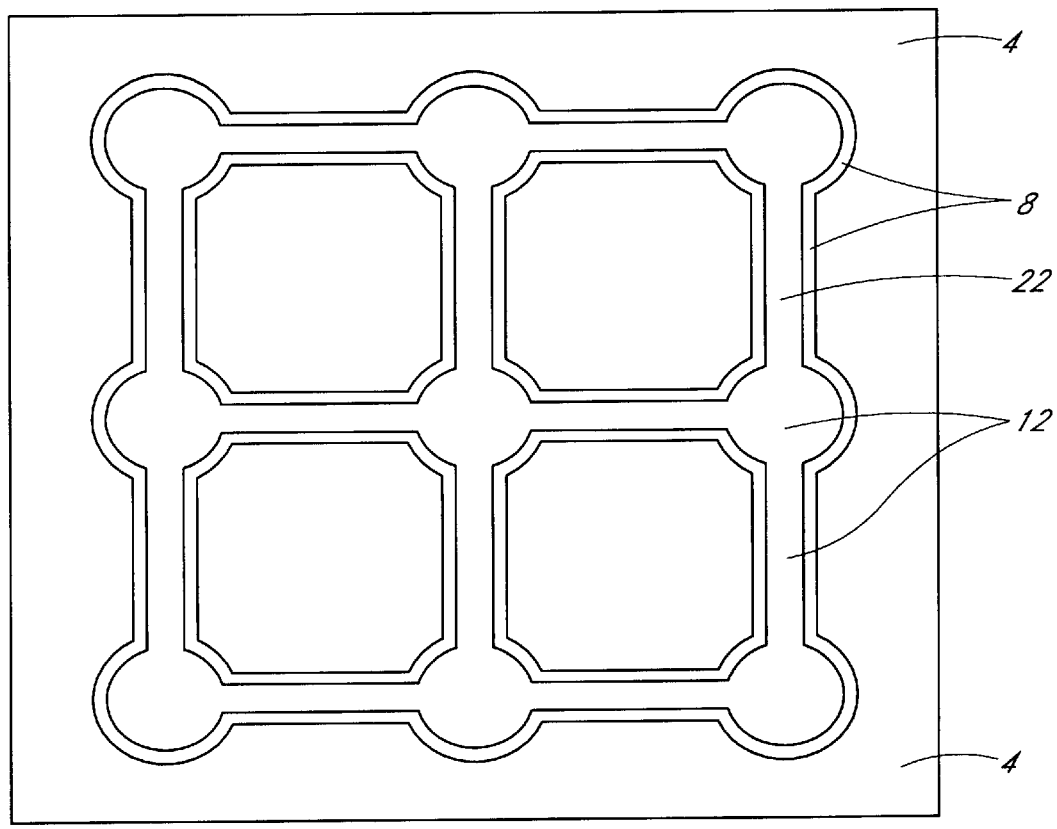
FIG. 18 is a schematic illustration of the plan view for the Emitter whose output area is made in the form of a set of nine truncated right angle cones arranged in order and connected together.

In the next embodiment of the Emitter 1, which is depicted in FIGS. 17 and 18, the OA 7 consists of a set of orderly truncated right circular cones and "connectors" 22 that connect the outer surfaces of all the indicated cones in two mutually perpendicular directions. Nine cones and twelve connectors are shown in FIG. 18. The inner surfaces 6 of the OA 7, like the injection areas 10, which have the same shape and area, are circular and are connected by the lower bases of the connectors 22. The circular inner surfaces 6 of the OA 7 lie on the cladding layer 4 and are arranged with a periodicity equal to twice diameter of the circles. The contact layer 17 comprises a GaAs substrate. Current is supplied through the one-piece ohmic contact 11 that is located on the contact layer 17 and through the ohmic contact 12 that is located on the outer surface 9 of all the cones and their connectors 22. A thickness of the OA 7 of only one micron or more can be ensured in this Emitter 1 by selecting the small areas for the injection area 10 (for example, by using injection areas 10 having diameters of approximately 10 $\mu$m or more). The manufacturing technology for this Emitter 1 design is simplified since the OA 7 layers can be grown in one process with the heterostructure 2, and the shape of the OA 7 can be formed using an chemically assisted ion-beam etching. See, for example, J. D. Chinn, et al., *J. Vac. Sci. Technol.*, Vol. A1, pp. 701–704 (1983). At the same time, this Emitter 1 of FIGS. 17 and 18 has high external efficiency as a result of having only small losses due to absorption in the OA 7. Additionally, this Emitter 1 does not have any basic limitations in size or shape of the luminescence, and consequently, could have high emission power and high light power. One or more of the OA 7 cones can advantageously be made with a large diameter (not shown in FIGS. 17 and 18) in order to connect one or several conducting wires 20 to the side of the OA 7.

Figure 2:
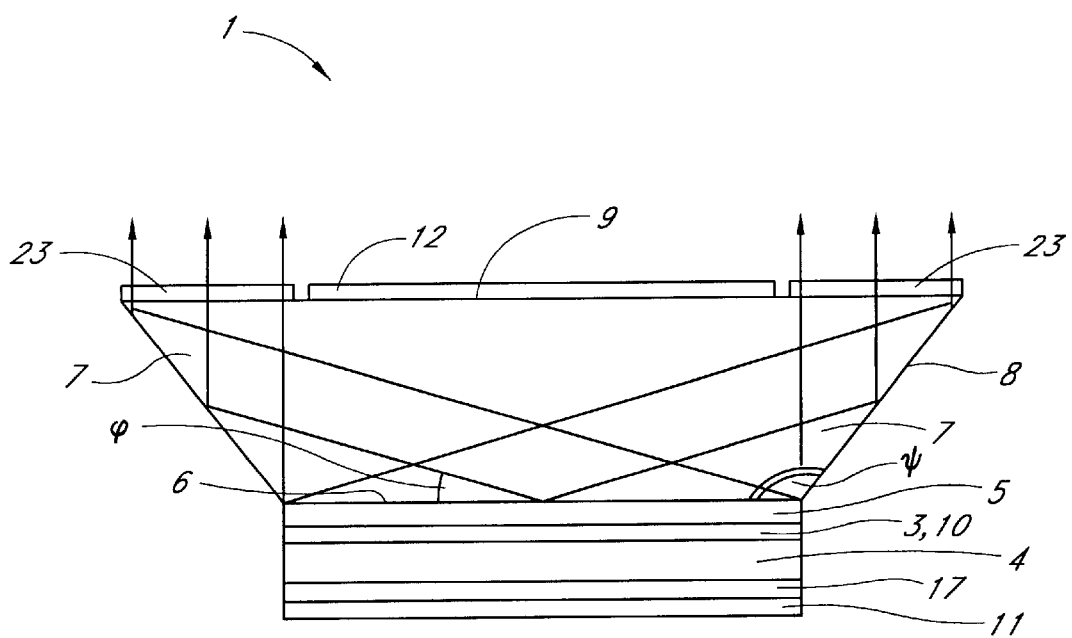
FIG. 2 is a schematic illustration of a cross-section of an emitter that passes through the central axis of symmetry of the emission output area made in the form of a truncated right angle cone, with the side surface of the emission output area forming a linear slope angle ψ with the inner surface of the output area, wherein ψ equals $(3\pi/4-\phi/2)$.
Figure 8:
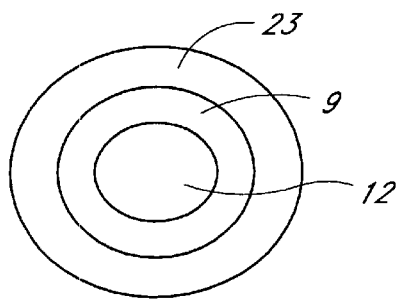
FIG. 8 is a schematic illustration of a view from above (i.e., from the side of the output area) for the Emitter having the cross-section depicted in FIG. 2.

In another embodiment of the Emitter 1 shown in FIGS. 2 and 8, the slope angles $\psi$, measured between side surface 8 of a conical OA 7 and the injection area plane 10, is $(3\pi/4-\phi/2)$, which in this case corresponds to, 126°. Consequently, the emission in the near field has a shape of a ring 900 $\mu$m wide and is localized at the outermost regions of exterior surface 9 of the OA 7 (i.e., the emission is located at the positions where it is reflected off the side surface 8 of the OA 7). Spontaneous emission exits the OA 7 in a direction perpendicular to the surface shown where the spontaneous emission emerges. Antireflection coatings 23 are formed on this surface. The coefficient $\mu$ for this Emitter 1 equals 0.685. Accordingly, the coefficient $\eta_\alpha$, and consequently, the coefficient $\eta$ are reduced in comparison with those values for the first embodiment of the Emitter 1. The other characteristics of the Emitter 1 of the second embodiment resemble those of the first embodiment.

Figure 3:
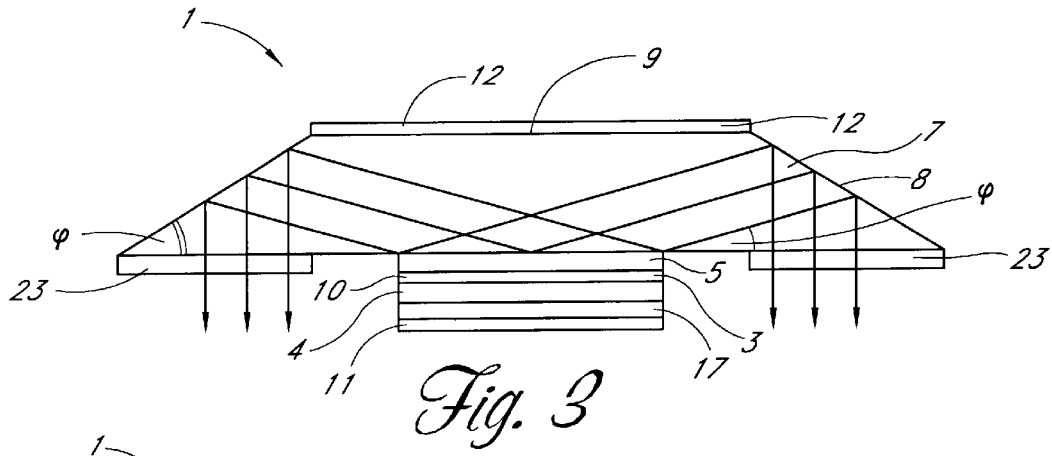
FIG. 3 is a schematic illustration of a cross-section of an emitter that passes through the central axis of symmetry of the emission output area made in the form of a truncated right angle cone, with the side surface of the emission output area forming a linear slope angle ψ with the inner surface of the output area, wherein ψ equals $(\pi/4-\phi/2)$.

FIG. 3 illustrates another embodiment of Emitter 1 wherein the slope angles $\psi$ of the side surface 8 of a conical OA 7 defined with respect to the plane of the injection area 10 equal $(\pi/4-\phi/2)$, which is equal to 36° in this case. Emission emerges from the inner surface 6 at the outer regions of the annular OA 7. These outer regions of the annular OA 7 have the antireflection coating 23 thereon and are free of the heterostructure 2, the contact 11 and the contact layer 17. In this embodiment, the coefficient $\mu$ is equal to 1.435.

Figures 4, 5:
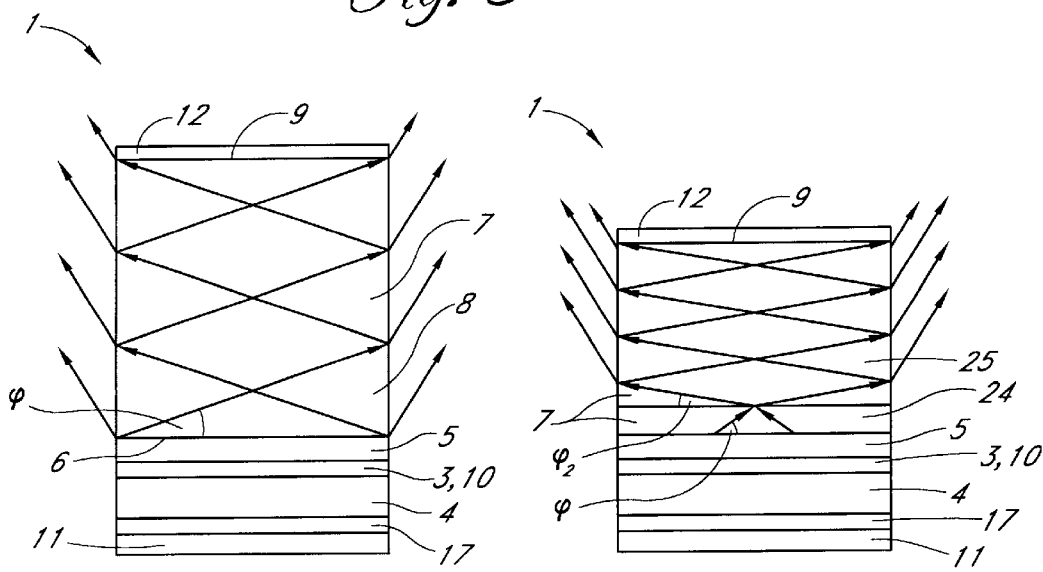
FIG. 4 is a schematic illustration of an axial cross-section passing through the central axis of symmetry of the emission output area made in the form of a right angle cylinder.
FIG. 5 is a schematic illustration of a cross-section along one of the sides of the emitters whose emission output area is formed as a rectangular parallelepiped, the emission optical area comprising two electrical conducting layers, the refractive index $n_{oa2}$ of the second layer exceeding the refractive index $n_{oa1}$ of the first layer that borders the heterostructure.
Figure 9:
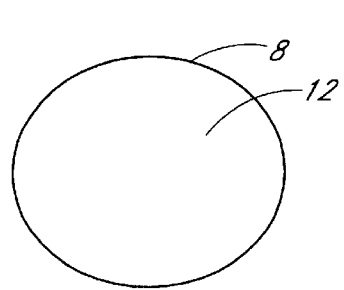
FIG. 9 is a schematic illustration of a view from above (i.e., from the side of the output area) for the Emitter having the cross-section depicted in FIG. 4.

In yet another embodiment of the Emitter 1 illustrated in FIGS. 4 and 9, the OA 7 comprises a right circular cylinder with a diameter $D_{is}$ equal to 3,000 $\mu$m. In FIGS. 4 and 9, the heterostructure 2 with the OA 7 attached yields an effective refractive index $n_{ef}$ that produces a propagation angle $\phi$ as defined in Equation (2) that does not exceed an angle $\sigma$ (the angle of total internal reflection), which equals 16°50'. This requirement was satisfied for this Emitter 1, by increasing the thickness of the cladding sublayer $I_2$ 14 and the cladding sublayer $II_1$ 15 to 0.1 $\mu$m, while reducing the thickness of the cladding sublayer $II_2$ 16 to 0.1 $\mu$m. (See the Table.) Employing these thicknesses reduced the angle $\phi$ to 16°30'. Additionally, in contrast to the embodiments described above, in this Emitter 1, some of the spontaneous emission emerges, while some is reflected from the side surface 8. The reflected light is reflected several more times before it emerges from the OA 7 (see FIG. 4). The number of these reflections depends on the reflection factor $R_n$ for spontaneous emission at output surface of the OA 7 with inclined incidence on it, which, in turn, depends on the angle of incidence of emission on side surface 8, equal to the angle $\phi$. In the Emitter 1 of FIGS. 4 and 9, movement of the beam in the OA 7 is orderly, which makes it possible for the beam to emerge from the OA 7 with low losses. The thickness of the OA 7 is advantageously selected to be 3,000 $\mu$m, which ensures three reflections of the beams before they reach the outer surface 9. The angle of emission incidence on the side surface 8 of the OA 7 equals 16°30', while the angle of refraction is equal to 79°20'. Other calculation data are:

the factor g equals 391 cm$^{-1}$;

the coefficient $\eta_{in}$ equals 0.9872;

the coefficient $\eta_\alpha$ equals 0.9098;

$R_n$ for non-polarized spontaneous emission equals 0.4198; and with three reflections inside the OA 7, the external efficiency $\eta$ equals 0.8098.

The quantity $\eta$ was calculated using the following formula that was obtained for an Emitter embodiment having inclined spontaneous emission incident on the output surface (in particular, with a cylindrical OA 7):

$$\eta = \eta_i \times \eta_{in} \times \eta_\alpha \times (1-R) \times [1+(\eta_\alpha \times \eta R_n)^1 + (\eta_{60} \times R_n)^2 + (\eta_\alpha \times R_n)^3 + \ldots \quad (13)$$

Thus, with the current J equal to 7.065 A (j equals 100 A/cm$^2$), the P from Equation (12) equals 11.74 W, $P_{light}$ equals 4,653 lumens, and $Q_{light}$ equals 18,276 cd.

Figure 10:
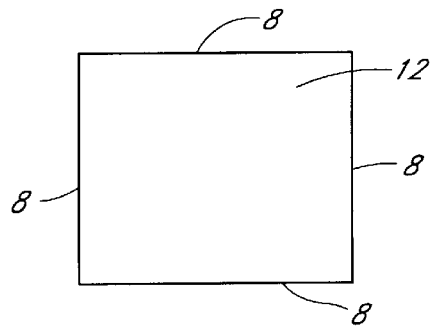
FIG. 10 is a schematic illustration of a view from above (i.e., from the side of the output area) for the Emitter having the cross-section depicted in FIG. 5.

The OA 7 for another embodiment of the Emitter 1 is shown in FIGS. 5 and 10. The OA 7 of FIGS. 5 and 10 is made as a rectangular parallelepiped, and comprises two layers 24 and 25 whose refractive indices are defined by the correlation (1); however, in this case, the refractive index of layer 25 is greater than the refractive index in the layer 24. Both the layer 24 and the layer 25 are conducting layers. The inner surface 6 as well as the injection area 10 are shaped as rectangles. The factor $R_n$, in contrast to the previous embodiments, depends on the emission incidence angle in the horizontal plane on the sides of the OA 7, and changes from 0.3 to 1. This results in a certain decrease in external effectiveness for this embodiment. The emission divergence angle $\theta_2$ in the horizontal plane, after emergence of emission from the OA 7 for each side, equals $\pi$ radians. The aforementioned dual-layer OA 7 composition reduces the total OA 7 thickness. Other characteristics and features of the Emitter 1 of FIGS. 5 and 10 are similar to the previous embodiments. Note that the Emitter 1 of FIGS. 5 and 10 is the easiest to manufacture.

For the aforementioned embodiments of FIGS. 1–4, in order to simplify the manufacturing technology and to lower the net cost of the emitters, the antireflection coatings 23 need not be applied to the output surfaces of the OA 7. However, multiple reflections from the side surface 8 of the OA 7 (as shown in FIGS. 4 and 5, and as well as being defined in formula (13)) may result. In addition, multiple re-emissions from the injection area 10 of emissions reflected into it from the side surface 8 of the OA 7 (as illustrated in FIGS. 1, 2 and 3, as well as being defined in formula (10)) may be produced. As a result of the two effects, the external efficiency factor (formula (10) and formula (13)) could be much smaller than when antireflection coatings are employed. Note also that in order to simplify the production technology of the proposed Emitters, the injection areas 10 of the Emitters may be formed without barrier regions (see, for example, FIGS. 1–5).

Figure 6:
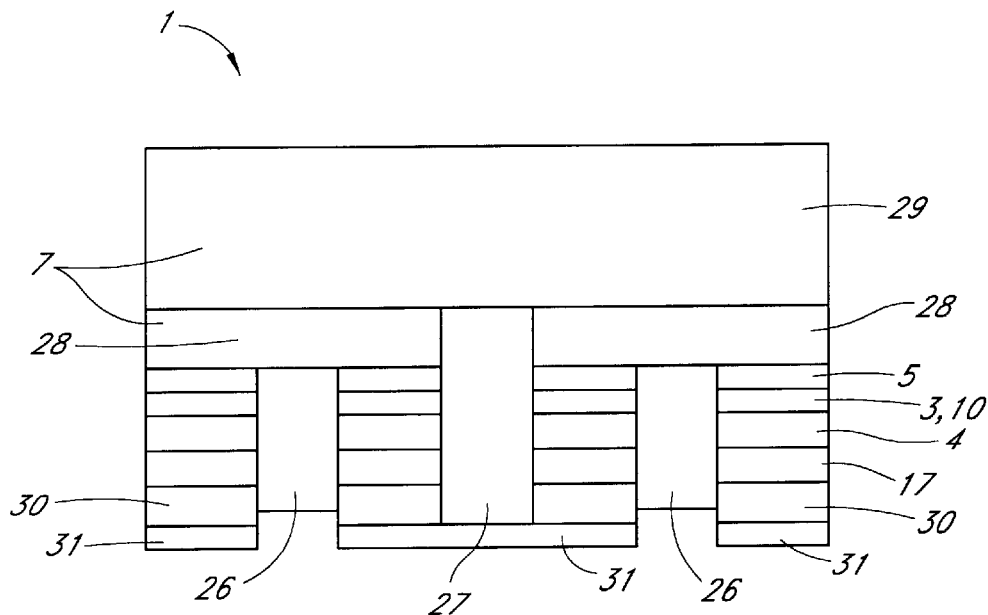
FIG. 6 is a schematic illustration of a cross-section along one of the sides of the emitters whose emission output area is formed as a rectangular parallelepiped, the emission optical area comprising two layers, the first layer being conducting, and the second being insulating, the injection areas being electrically connected in series.

In another embodiment, a more effective coupling of powerful emitters with a power source that provides increased voltage can be achieved by forming the injection areas 10 and electrical connections thereto with barrier areas 26 and 27 introduced between the injection areas 10, as shown in FIG. 6. The OA 7 in FIG. 6 comprises an electrical conducting layer 28 and an insulating layer 29. The barrier layer 26 on one side of injection area 10 provides electrical isolation, at least up to the cladding layer 5. The barrier layer 27 on the other side of the injection area 10 provides electrical isolation, at least up to the insulating layer 29 of the OA 7. In this embodiment, independent ohmic contacts 30 of the two neighboring injection areas 10, which are separated by barrier layer 27, are connected in pairs by metal coating layers 31, as shown in FIG. 6.

Figure 12:
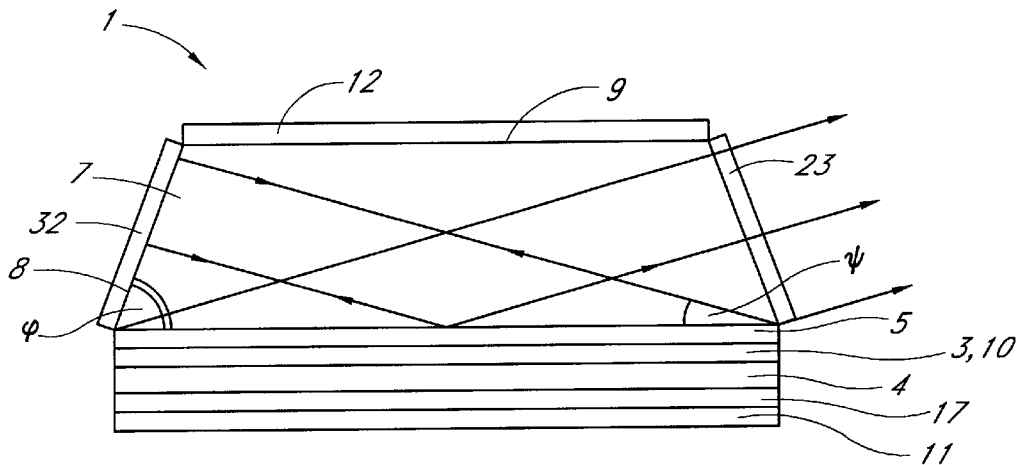
FIG. 12 is a schematic illustration of a longitudinal view of an Emitter for which the emission output passes through one side facet of the hexahedral emission output area, wherein the spatial extent of the near field emission is small but the emission is bright.
Figure 13:
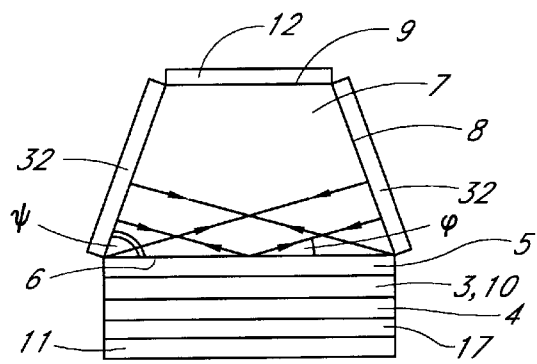
FIG. 13 is a schematic illustration of a cross-sectional view of the Emitter of FIG. 12.

As shown in FIGS. 12 and 13, for embodiments of the Emitter 1 having near field emissions of a small spatial extent and an enhanced emission brightness, can be made with an OA 7 comprising a hexahedron whose internal surface 6 and external surface 9 are rectangles. The sides of the rectangle of the inner surface 6 are 1,000 $\mu$m×3,000 $\mu$m. The injection area 10 has the same dimensions and the same area. The side surfaces 8 of the hexahedron form 4 faces. An antireflection coating 23 is formed on one of the faces (output surface), and reflecting coatings 32 are formed on the remaining three faces. All the faces have the same slope angles $\psi$, equal to $(\pi/2-\phi)$, which, in the preferred embodiment is 72°. In the working device, the emission falling on the three faces will be reflected and returned to the injection area 10 at the same propagation angle $\phi$ equal to 18°. Note that the full divergence angle $\Delta\phi$, in the same way as for the aforementioned embodiment of FIG. 1, equals 0.68° (11.8 mrad). The quantity $\Delta\phi/2$ equal to 0.34° corresponds to the accuracy with which sloped edges of OA 7 must be made for Emitter 1 to reach maximum efficiency. An evaluation demonstrates that most of this returned emission will be extracted from OA 7 through the output surface approximately with the same external efficiency $\eta$ as for Emitter 1 of the first embodiment discussed herein. In this case, power P (defined by the formula (12)) equals 5.3 W for a current J equal to 3.0 A. The resulting power, relative to a unit of area of the near field emission, equals 800.6 W/cm², which is almost ten times higher than for the first embodiment of the Emitter 1. Divergence angles $\theta_1$ and $\theta_2$ for this Emitter 1 in the vertical and horizontal planes equal 2.3° and 90°, respectively. The light intensity $Q_{light}$ in this case equals 19,327 cd.

Note that the reduction in the dimensions of the spatial extent of the near field emission and the increase in the brightness of the near field emission can also be obtained for other embodiments of the Emitter 1 that are illustrated in FIGS. 2 and 8, in FIGS. 3 and 9, in FIG. 4, and in FIGS. 5 and 10, by applying reflecting coatings on some of their output surfaces.

Figure 14:
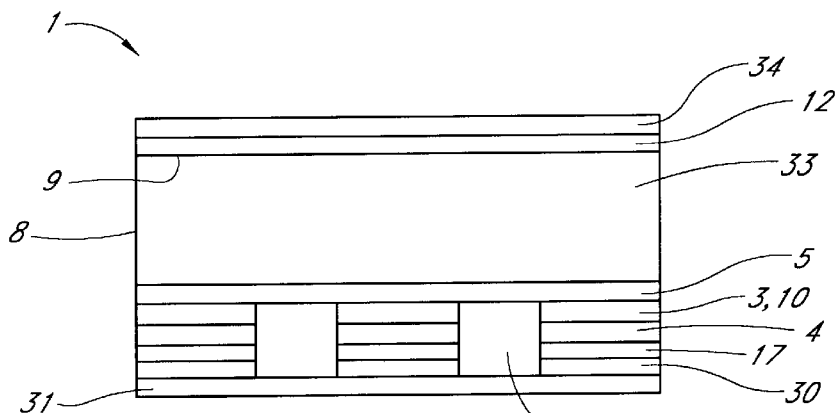
FIG. 14 is a schematic illustration of a cross-section along the length of a linear sequence of injection areas for an Emitter with a set of spontaneous emission beams whose output area is common for each linear sequence of injection areas, wherein the output area is in the form of a set of orderly interconnected right angle cylinders.
Figure 15:
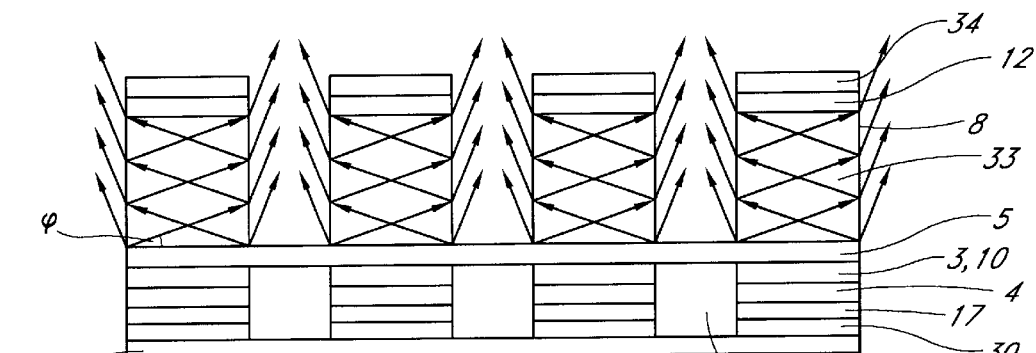
FIG. 15 is a schematic illustration of the cross-section perpendicular to the length of the linear sequence of injection areas for the Emitter with a set of spontaneous emission beams whose output area is common for each linear sequence of injection areas, wherein the output area is in the form of a set of orderly interconnected right angle cylinders.
Figure 16:
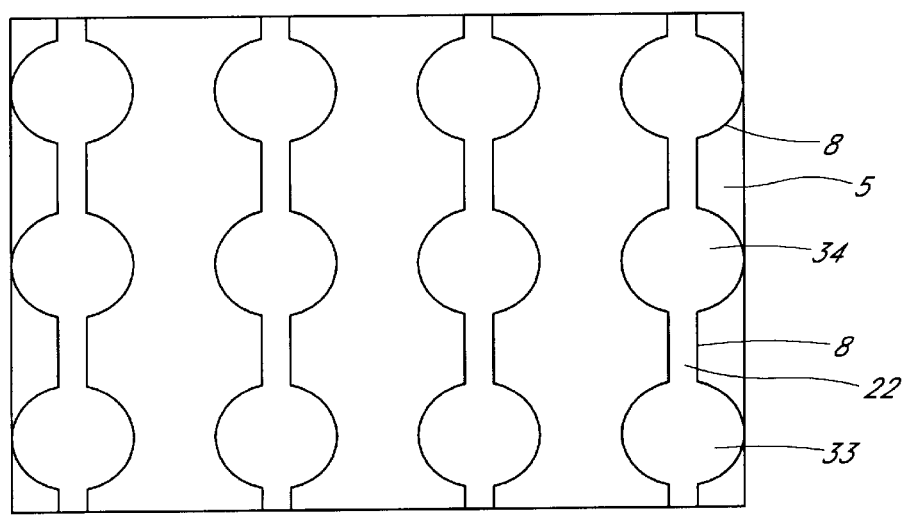
FIG. 16 is a schematic illustration of a top plan view of the Emitter depicted in FIGS. 14 and 15.

FIGS. 14, 15 and 16 illustrate further embodiments of the Emitter 1 with a set of independently controllable beams. In the embodiment of FIGS. 14, 15 and 16, 200 linear sequences (lines) of injection areas 10 are formed on the layer 5 of the heterostructure 2 using barrier regions 26. Each of the linear sequences (lines) comprises 500 injection areas 10. The diameter of each injection area 10 equals 18 $\mu$m, and with the same spacing of 30 $\mu$m. The injection areas 10 are arranged in two mutually perpendicular directions. Each line corresponds to the OA 7 of a linear sequence of right circular cylinders with a diameter of 18 $\mu$m. The cylinders are coaxial with each injection area 10 in the line, and are linked by connectors 22 to create a single linear OA 7 that is 9 $\mu$m thick. Each connector 22 is 12 $\mu$m long and is 6 $\mu$m wide. The total size of the Emitter 1 in FIGS. 14, 15 and 16 is 15 mm×6 mm. On the outer surfaces 9 of the single OA 7 of each line, the ohmic contacts 12 are formed with metal coating layers 34 on them, corresponding to 200 bands. From the opposite side to the injection areas 10, independent ohmic contacts 30 and metal coating layers 31 (500 bands) connect the injection areas 10 in a direction perpendicular to the line length. Preparation for the Emitter 1 uses the known methods of planar technology, including photolithographic processes with two-sided fusing, and chemical assisted ion-beam etching (CAIBE). During manufacture, the Emitter 1 is installed on the fixing plates that are not shown in the figures. Calculations made for this Emitter 1 yielded the following results:

Output emission oriented at 10°40' angle to side surface 8 of OA 7 has a divergence A equal to 9°10';

External efficiency factor $\eta$ for three reflections equals 0.9566;

Power P (from formula (12)) from one injection area 10 is 2 mW for a current of 1.017 mA (j equals 400 A/cm²);

Each emission beam (of 10,000 beams) can be engaged independent of the others; and Beam density is 11,111 cm⁻².

Figure 19:
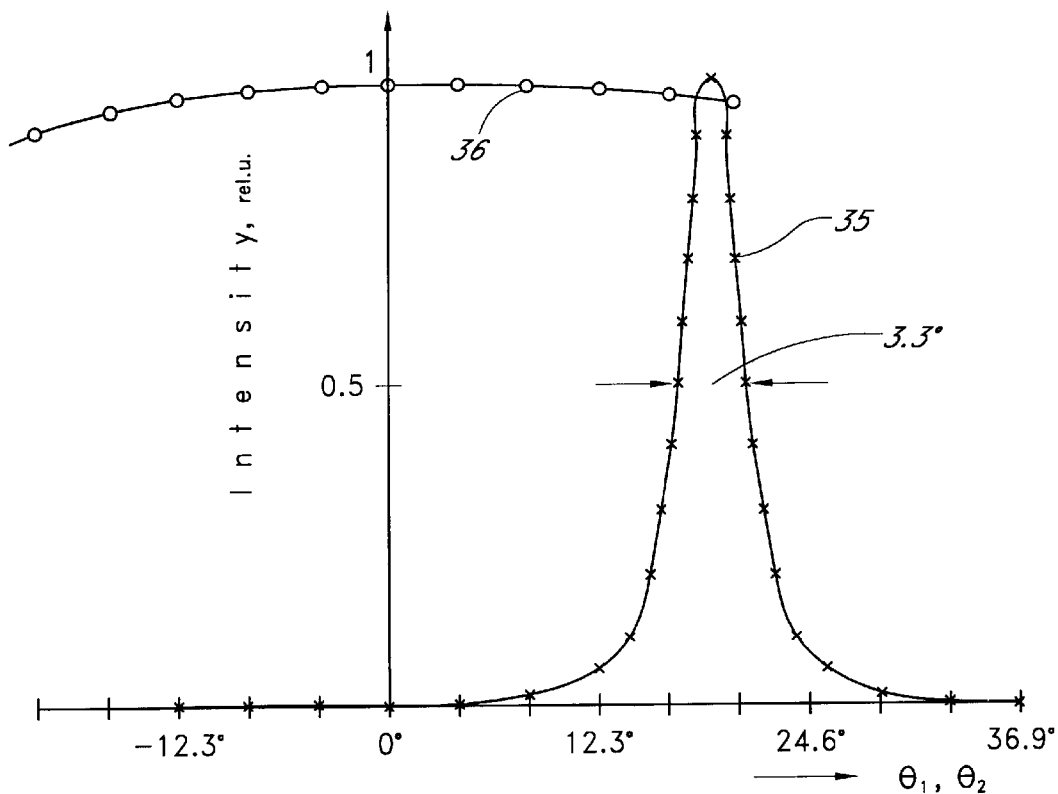
FIG. 19 illustrates the results of experimental measurements of divergence angles of emission in vertical ($\theta_1$) and horizontal ($\theta_2$) planes.
Figure 20:
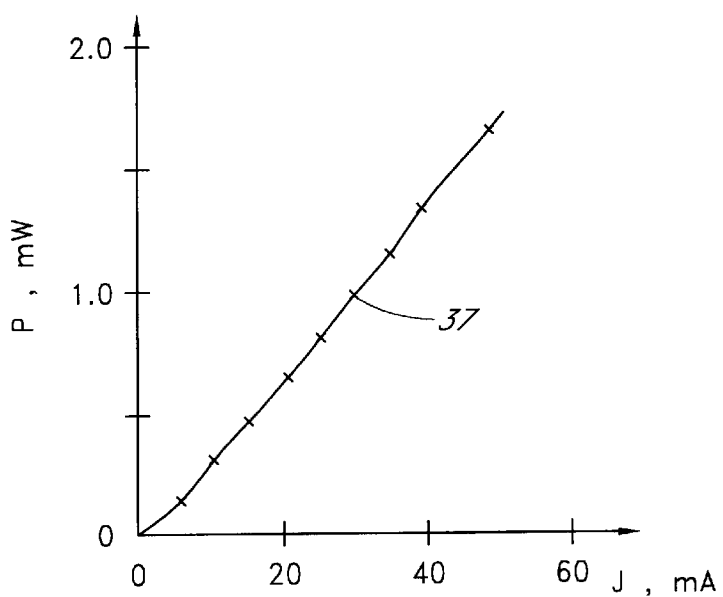
FIG. 20 illustrates plots of the dependence of emission power on current for an experimental Emitter sample.

FIGS. 19 and 20 set forth the results of preliminary measurements of an experimental Emitter model produced in accordance with the present invention. The results confirm that the present invention generates spontaneous emission having a narrow beam pattern. The emitters that were used in the preliminary measurements are based on a special calculated heterostructure (made of GaInAs/GaAs/AlGaAs compounds) that provides intensive emission efflux for a wavelength of 980 nanometers. The injection area has dimensions 50 $\mu$m×500 $\mu$m. The OA 7 is a hexahedron with the side surfaces 8 of three faces at slope angles $\psi$ equal to 90°, and with one output side surface 8 on a face at a slope angle $\psi$ equal to 72°. In the experimental embodiment used for the measurements, there are no coatings on the Emitter 1. It follows from the measurement data (e.g., the curve 35 in FIG. 19), that the divergence angle $\theta_1$ of the spontaneous output emission (at level 0.5) in the vertical plane equals 3.3°. In this case, the emission is sloped to the active layer plane at an angle of 19°, which compares well with the calculation angle of 18.5°. In the horizontal plane, as expected, emission is essentially not directed (see the curve 36 in FIG. 19). The measurement results of the watt-ampere characteristic curve (the curve 37 in FIG. 20) indicate that it is possible to obtain high efficiency for the Emitters 1 in accordance with the preferred embodiments of the present invention. Note that the measurements are made for an experimental model that is not of the optimal design, the power is measured from the inclined side face, and the width of the injection area in this case is 50 $\mu$m. Note also that in a continuous operating mode, there is a linear dependence of the power P (in milliwatts) on the working current J (in milliamperes) all the way to current densities j equal to 400 A/cm². This indicates satisfactory heat removal in the Emitters of the present invention.

Injection incoherent emitters are used in information display devices such as light-emitting indicators, traffic signals, full-color displays, screens, and projection televisions. Such emitters can be employed in fiber-optic communications and in information transmission systems. Additionally, injection incoherent emitters can be used in developing medical equipment and for exciting solid-state and fiber lasers and amplifiers. These emitters can also be employed as white light LEDs instead of traditional incandescent bulbs and fluorescent light sources.

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

comprising a plurality of cladding sublayers $I_i$ where $i=1, 2, \ldots k$, the second cladding layer comprising a plurality of cladding sublayers $II_j$, where $j=1, 2, \ldots m$, where i and j are defined as whole numbers that designate the ordinal number of respective cladding sublayers enumerated from the active layer, the cladding sublayers having respective refractive indices $n_{Ii}$ and $n_{IIj}$.

4. The injection incoherent emitter as defined in claim 3, wherein at least one heterostructure cladding layer is formed as a gradient.

TABLE

| Designation, No. of layers, sublayers, regions 1 | Composition of layer 2 | Layer Thickness D, microns 3 | Index of refraction, n 4 | Conductivity type 5 | Carriers Concentration N, cm$^{-3}$ 6 | Index of Absorption $\alpha$, cm$^{-1}$ 7 |
|---|---|---|---|---|---|---|
| Contact layer 17 | GaAs | 0.3 | 3.878 | P | $2 \times 10^{19}$ | $10^4$ |
| Cladding layer 4 | | | | | | |
| with sublayer 13 | $(Al_{30.7}Ga_{0.3})_{0.5}In_{0.5}P$ | 1.2 | 3.241 | P | $5 \times 10^{17}$ | 1.0 |
| and sublayer 14 | $(Al_{0.5}Ga_{0.5})_{0.5}In_{0.5}P$ | 0.07 | 3.341 | — | — | 1.0 |
| Active layer 3 | $(Al_{0.22}Ga_{0.78})_{0.5}In_{0.5}P$ | 0.008 | 3.482 | — | — | 1.0 |
| Cladding layer 5 | | | | | | |
| with sublayer 15 | $(Al_{0.5}Ga_{0.5})_{0.5}In_{0.5}P$ | 0.07 | 3.341 | — | — | 1.0 |
| and sublayer 16 | $(Al_{0.7}Ga_{0.3})In_{0.5}P$ | 0.2 | 3.241 | N | $5 \times 10^{17}$ | 1.0 |
| Outlet region 7 | GaP | 921.0 | 3.46 | N | $1 \times 10^{18}$ | 1.0 |

What is claimed is:

1. An injection incoherent emitter comprising:
   a heterostructure comprising:
      at least one active layer;
      cladding layers; and
      ohmic contacts, and
   at least one emission output area on at least one side of the active layer, the emission output area adjoining at least one of the cladding layers, the emission output area being transparent for emission, the emission output area comprising at least one emission output area layer having a refractive index $n_{oaq}$, where $q=1, 2, \ldots p$ is defined as a whole number that designates the ordinal number of the emission output area layer enumerated from a boundary of the emission output area with the heterostructure, the emission output area and the heterostructure together having an effective refractive index $n_{ef}$, the effective refractive index $n_{ef}$ of the heterostructure and the emission output area and the refractive index $n_{oa1}$ of the emission output area being selected to satisfy the correlations:

$$\text{arc } \cos(n_{ef}/n_{oa1}) \geq \text{arc } \cos(n_{ef\,min}/n_{oa1})$$

and $n_{ef\,min}$ is greater than $n_{min}$;

where $n_{ef\,min}$ is the minimum value of $n_{ef}$ for heterostructures and adjoining emission output areas that produce spontaneous emission, and where $n_{min}$ is the least of the refractive indices in the heterostructure cladding layer.

2. The injection incoherent emitter as defined in claim 1, wherein the active layer of the heterostructure comprises at least one sublayer.

3. The injection incoherent emitter as defined in claim 1, wherein a first cladding layer is located on a first surface of the active layer and a second cladding layer is located on a second surface of the active layer, the first cladding layer 5. The injection incoherent emitter as defined in claim 1, wherein the heterostructure comprises at least one injection area.

6. The injection incoherent emitter as defined in claim 5, wherein:
   the injection area has dimensions and an area $S_{ia}$ and the emission output area has a surface adjoining a boundary layer of the heterostructure with dimensions and an area $S_{is}$; and
   the dimensions and area $S_{ia}$ of the injection area do not exceed the dimensions and area $S_{is}$ of the emission output area surface adjoining the boundary layer of the heterostructure.

7. The injection incoherent emitter as defined in claim 1, wherein each cladding layer has a respective thickness, the thickness of the cladding layer adjoining the emission output area being less than the thickness of the cladding layer located on the opposite side of the active layer.

8. The injection incoherent emitter as defined in claim 1, wherein each cladding layer has a respective refractive index, the refractive index of the cladding sublayer adjoining the emission output area being greater than the refractive index of the cladding sublayer located on the opposite side of the active layer.

9. The injection incoherent emitter as defined in claim 1, wherein the emission output area layer has a thickness $d_{oaq}$ in the range 1 $\mu$m to 10,000 $\mu$m.

10. The injection incoherent emitter as defined in claim 1, wherein the emission output area is conducting.

11. The injection incoherent emitter as defined in claim 10, wherein:
   the emission output area has an internal surface and at least one outer surface opposite the internal surface; and
   ohmic contact is formed to the at least one outer surface of the emission output area.

12. The injection incoherent emitter as defined in claim 1, wherein the emission output area comprises optically homogeneous material.

13. The injection incoherent emitter as defined in claim 1, wherein:
  the emission output area comprises at least a first layer and a second layer;
  the first layer borders the heterostructure, conducts, and comprises a material having an optical loss factor $\alpha_{oa1}$; and
  the second layer comprises material that has an optical loss factor $\alpha_{oa2}$ that is lower than the optical loss factor $\alpha_{oa1}$ for the first layer.

14. The injection incoherent emitter as defined in claim 13, wherein the second layer is insulating.

15. The injection incoherent emitter as defined in claim 14, wherein:
  the heterostructure includes at least two neighboring injection areas, the neighboring injection areas being electrically separated at least to the insulating second layer of the emission output area; and
  the neighboring injection areas include ohmic contacts that are electrically connected by a metal coating layer.

16. The injection incoherent emitter as defined in claim 13, wherein the first layer has a refractive index $n_{oa1}$ and the second layer has a refractive index $n_{oa2}$, the refractive index $n_{oa2}$ of the second layer being smaller than the refractive index $n_{oa1}$ of the first layer.

17. The injection incoherent emitter as defined in claim 1, wherein at least one layer of the emission output area comprises a semiconductor.

18. The injection incoherent emitter as defined in claim 1, wherein at least one layer of the emission output area comprises a substrate material.

19. The injection incoherent emitter as defined in claim 1, wherein an ohmic contact is made to a first emission output area layer, said layer being conductive.

20. The injection incoherent emitter as defined in claim 1, wherein the emission output area comprises at least one truncated right cone, the cone having at least one base located on the cladding sublayer adjoining the emission output area.

21. The injection incoherent emitter as defined in claim 20, wherein:
  the truncated right cone of the emission output area has a side surface and an inner surface;
  the side surface is generated by a generatrix having a linear slope angle $\psi$ with respect to the inner surface, the angle $\psi$ selected to be in the range $(\pi/2-\phi-\sigma)$ to $(\pi/2-\phi+\sigma)$, wherein:
    $\phi$ is an angle between a plane defined by the active layer and a perpendicular to an emission front propagating in the emission output area; and
    $\sigma$ is an angle of total internal reflection from the side surface for emission propagating in the emission output region.

22. The injection incoherent emitter as defined in claim 20, wherein:
  the truncated right cone of the emission output area has a side surface and an inner surface;
  the side surface is generated by a generatrix having a linear slope angle $\psi$ with respect to the inner surface, the angle $\psi$ selected to be in the range $(3\pi/4-\phi/2-\sigma/2)$ to $(3\pi/4-\phi/2+\sigma/2)$, wherein:
    $\phi$ is an angle between a plane defined by the active layer and a perpendicular to an emission front propagating in the emission output area; and
    $\sigma$ is an angle of total internal reflection from the side surface for emission propagating in the emission output region.

23. The injection incoherent emitter as defined in claim 20, wherein:
  the truncated right cone of the emission output area has a side surface and an inner surface;
  the side surface is generated by a generatrix having a linear slope angle $\psi$ with respect to the inner surface, the angle $\psi$ selected to be in the range $(\pi/4-\phi/2-\sigma/2)$ to $(\pi/4-\phi/2+\sigma/2)$, wherein:
    $\phi$ is an angle between a plane defined by the active layer and a perpendicular to an emission front propagating in the emission output area; and
    $\sigma$ is an angle of total internal reflection from the side surface for emission propagating in the emission output region.

24. The injection incoherent emitter as defined in claim 1, wherein the emission output area is formed as at least one right circular cylinder, the cylinder having a base located on the cladding layer adjoining the emission output area.

25. The injection incoherent emitter as defined in claim 1, wherein the emission output area is formed as at least one hexahedron, the hexahedron having a base located on the cladding layer adjoining the emission output area.

26. The injection incoherent emitter as defined in claim 25, wherein:
  the at least one hexahedron has at least one side surface and an inner surface, the side surface having a linear slope angle $\psi$ with respect to the inner surface is selected from a range of $(\pi/2-\phi-\Delta\phi/2)$ to $(\pi/2-\phi+\Delta\phi/2)$;
  $\phi$ is a propagation angle between a plane defined by the active layer and a perpendicular to an emission front propagating in the emission output area; and
  $\Delta\phi$ is an emission divergence angle in a vertical plane.

27. The injection incoherent emitter as defined in claim 25, wherein:
  the at least one hexahedron has at least one side surface and an inner surface, the side surface having a linear slope angle $\psi$ with respect to the inner surface is selected from a range of $(3\pi/4-\phi/2-\Delta\phi/2)$ to $(3\pi/4-\phi/2+\Delta\phi/2)$;
  $\phi$ is a propagation angle between a plane defined by the active layer and a perpendicular to an emission front propagating in the emission output area; and
  $\Delta\phi$ is an emission divergence angle in a vertical plane.

28. The injection incoherent emitter as defined in claim 25, wherein:
  the at least one hexahedron has at least one side surface and an inner surface, the side surface having a linear slope angle $\psi$ with respect to the inner surface is selected from a range of $(\pi/4-\phi/2-\Delta\phi/2)$ to $(\pi/4-\phi/2+\Delta\phi/2)$;
  $\phi$ is a propagation angle between a plane defined by the active layer and a perpendicular to an emission front propagating in the emission output area; and
  $\Delta\phi$ is an emission divergence angle in a vertical plane.

29. The injection incoherent emitter as defined in claim 25, wherein the at least one hexahedron has at least one side surface and an inner surface, the side surface having a linear slope angle $\psi$ with respect to the inner surface of $\pi/2$.

30. The injection incoherent emitter as defined in claim 1, wherein:
  $\phi$ is an angle between a plane defined by the active layer and a perpendicular to an emission front propagating in the emission output area; and
  $\sigma$ is an angle of total internal reflection from a side surface of the emission output area for emission propagating in the emission output region, the angle of total reflection $\sigma$ being greater than the propagation angle $\phi$.

31. The injection incoherent emitter as defined in claim 1, wherein the emission output area has at least one output surface, at least a portion of the at least one output surface having an antireflection coating thereon.

32. The injection incoherent emitter as defined in claim 1, wherein the emission output area has at least one output surface, at least a portion of the at least one output surface having a reflection coating thereon.

33. The injection incoherent emitter as defined in claim 1, wherein the heterostructure comprises at least two injection areas, each injection area having a propagation angle, the propagation angles of the injection areas being the equal.

34. The injection incoherent emitter as defined in claim 33, wherein an independent ohmic contact is made to each injection area from an external side of the heterostructure.

35. The injection incoherent emitter as defined in claim 33, wherein each injection area is associated with one of the at least one emission output areas.

36. The injection incoherent emitter as defined in claim 35, wherein at least two of the injection areas are associated with a common one of the at least one emission output areas.

37. The injection incoherent emitter as defined in claim 1, wherein the heterostructure comprises a plurality of injection areas having equal dimensions, the injection areas being arranged along a line as a linear sequence of injection areas.

38. The injection incoherent emitter as defined in claim 37, wherein the plurality of injection areas are electrically connected by a metal coating layer formed in at least one band.

39. The injection incoherent emitter as defined in claim 38, wherein the heterostructure comprises at least two linear sequences of injection areas, the plurality of injection areas in each linear sequence being connected by a respective band.

40. The injection incoherent emitter as defined in claim 39, further comprising a band which electrically connects one injection area from each of the linear sequences.

41. The injection incoherent emitter as defined in claim 1, wherein each injection area is bounded by injected barrier layers.

* * * * *

UNITED STATES PATENT AND TRADEMARK OFFICE
CERTIFICATE OF CORRECTION

PATENT NO.    : 6,429,462 B1
DATED         : August 6, 2002
INVENTOR(S)   : Vasily I. Shveykin It is certified that error appears in the above-identified patent and that said Letters Patent is hereby corrected as shown below:

<u>Title page,</u>
Insert the following:

-- [30]          Foreign Application Priority Data

Dec. 29, 1998    (RU) ......................................... 98123248 --

Signed and Sealed this

Thirteenth Day of May, 2003

JAMES E. ROGAN
*Director of the United States Patent and Trademark Office*